(12) United States Patent
Masuda et al.

(10) Patent No.: US 7,405,468 B2
(45) Date of Patent: Jul. 29, 2008

(54) PLASTIC PACKAGE AND METHOD OF FABRICATING THE SAME

(75) Inventors: Masachika Masuda, Shinjuku-ku (JP); Chikao Ikenaga, Shinjuku-ku (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 345 days.

(21) Appl. No.: 10/821,173

(22) Filed: Apr. 9, 2004

(65) Prior Publication Data
US 2005/0093117 A1    May 5, 2005

(30) Foreign Application Priority Data

| Apr. 11, 2003 | (JP) | ............................... 2003-107731 |
| Apr. 17, 2003 | (JP) | ............................... 2003-112773 |
| Apr. 28, 2003 | (JP) | ............................... 2003-123550 |

(51) Int. Cl.
*H01L 23/495* (2006.01)

(52) U.S. Cl. ...................... 257/676; 257/777; 257/778; 438/108; 438/110; 438/123

(58) Field of Classification Search ................ 257/676, 257/685, 689, 687, 777, 778; 438/108, 110, 438/123
See application file for complete search history.

(56) References Cited

U.S. PATENT DOCUMENTS

| 6,201,292 B1 * | 3/2001 | Yagi et al. .................... 257/666 |
| 6,337,510 B1 * | 1/2002 | Chun-Jen et al. ............ 257/666 |
| 6,630,729 B2 * | 10/2003 | Huang ......................... 257/676 |
| 6,876,066 B2 * | 4/2005 | Fee et al. ..................... 257/666 |

* cited by examiner

*Primary Examiner*—W. David Coleman
*Assistant Examiner*—Su C Kim
(74) *Attorney, Agent, or Firm*—Oliff & Berridge, PLC

(57) ABSTRACT

A plastic package includes a plurality of terminal members each having an outer terminal, an inner terminal, and a connecting part connecting the outer and the inner terminal; a semiconductor device provided with terminal pads connected to the inner terminals with bond wires; and a resin molding sealing the terminal members, the semiconductor device and the bond wires therein. The inner terminals of the terminal members are thinner than the outer terminals and have contact surfaces. The upper, the lower and the outer side surfaces of the outer terminals, and the lower surfaces of the semiconductor device are exposed outside. The inner terminals, the bond wires, the semiconductor device and the resin molding are included in the thickness of the outer terminals.

4 Claims, 27 Drawing Sheets

PLASTIC PACKAGE AND METHOD OF FABRICATING THE SAME

TECHNICAL FIELD

The present invention relates to a small, thin plastic package, a stacked plastic package built by stacking small, thin plastic packages, and a method of fabricating such plastic packages.

BACKGROUND ART

High-density packaging of semiconductor devices for electronic appliances has been desired for downsizing electronic appliances. Miniaturization and thickness reduction of semiconductor parts have progressed, and packages that enable further thickness reduction and cost reduction are demanded.

Under such circumstances, techniques have been proposed to cope with thickness reduction. A plastic package proposed in JP 11-307675 A has a lead frame having exposed upper and lower surfaces. A plastic package proposed in JP 11-260989 has leads including those which are exposed and used as outer terminals.

On the other hand, efforts are being made to achieve one-chip system LSI. Two-dimensional wiring limits increasing operating speed by shortening wiring lines, and the development of techniques to achieve one-chip system LSI requires high development costs and long development time. Recently, trials have been made to achieve system LSI by using packages built up by stacking semiconductor devices for three-dimensional arrangement.

Such packages are called also system packages.

A stacked, plastic package disclosed in JP 11-307675 A is built by stacking plastic packages, and leads each having exposed upper and lower surfaces are used for electrical connection. However, those plastic packages are provided with a die pad and hence it is difficult to reduce the thickness of those plastic packages.

The plastic package mentioned in JP 11-260989 A cannot be formed in a stacked structure.

A package disclosed in JP 200-33434 A is formed by stacking semiconductor devices (chips) and sealing the stacked semiconductor devices in a package. This package has low application flexibility and is difficult to apply to general purposes.

JP 11-307675 A
JP 11-260989 A
JP 200-33434 A

Thus, semiconductor parts have been progressively miniaturized and made thinner, and still thinner packages have been demanded. Efforts have been made to fabricate system packages, to construct a system package by stacking a plurality of plastic packages, but further thickness reduction of the plastic packages is necessary.

DISCLOSURE OF THE INVENTION

The present invention has been made to meet the foregoing requirements and it is therefore an object of the present invention to provide a package capable of further reducing the thickness of a semiconductor device at a low cost. More concretely, the present invention provides a stacked, plastic package realizing a stacked system package built by stacking a plurality of plastic packages. Thus, the present invention provides an easily mass-producible plastic package.

Another object of the present invention is to provide an easily mass-producible semiconductor device suitable for achieving the further reduction of the thickness of a semiconductor part at a low cost. A third object of the present invention is to provide a stacked plastic package built by stacking such thin plastic packages and realizing the so-called stacked system package.

A fourth object of the present invention is to provide a method of fabricating such a thin plastic package.

A plastic package according to the present invention includes: a plurality of terminal members each having an outer terminal having an upper surface, a lower surface and an outer side surface, an inner terminal having a contact surface, and a connecting part connecting the outer and the inner terminal; a semiconductor device provided with terminal pads connected to the contact surfaces of the inner terminals with bond wires; and a resin molding sealing the terminal members, the semiconductor device and the bond wires therein; wherein the inner terminals of the terminal members are thinner than the outer terminals and have the contact surfaces, the contact surfaces of the inner terminals, the upper surfaces of the outer terminals, the lower surfaces of the outer terminals of the terminal members are included in planes, respectively, and the upper, the lower and the outer side surfaces of the outer terminals of the terminal members, and a surface of the semiconductor device opposite the surface provided with the terminal pads are exposed outside, and the inner terminals, the bond wires, the semiconductor device and the resin molding are included in the thickness of the outer terminals.

In the plastic package according to the present invention, the outer terminal of each terminal member has a cut part on the outer side surface.

In the plastic package according to the present invention, each terminal member is formed of Cu, a Cu-base alloy or a Fe—Ni alloy containing 42% Ni.

In the plastic package according to the present invention, the contact surfaces of the inner terminals, and the upper and the lower surfaces of the outer terminals of the terminal members are coated with a plated metal layer selected from a plated solder layer, a plated gold layer, a plated silver layer, a plated palladium layer and a plated tin layer.

A plastic package fabricating method according to the present invention includes the steps of: forming a processed sheet having at least one pair of terminal members connected to each other through a connection, each having an outer terminal, an inner terminal and a connecting part connecting the outer and the inner terminal by subjecting a terminal forming sheet to a half-etching process; attaching the processed sheet to a semiconductor device supporting tape with a surface thereof opposite a half-etched surface in contact with the semiconductor device supporting tape, and attaching a semiconductor device to the semiconductor device supporting tape; connecting the inner terminals of the terminal members of the processed sheet to the semiconductor device with bond wires; sealing the processed sheet and the semiconductor device held between a pair of flat molding plates in a resin molding by a molding process; and finishing a plastic package by removing the pair of flat molding plates and the semiconductor device supporting tape from the resin molding, attaching a cutting tape to the resin molding, and cutting parts, corresponding to the connection of the processed sheet, of the resin molding from a side opposite the side of the cutting tape.

In the plastic package fabricating method according to the present invention, the semiconductor device supporting tape is a flat suction plate.

In the plastic package fabricating method according to the present invention, the flat suction plate is provided with suction holes arranged in its entire surface.

In the plastic package fabricating method according to the present invention, the semiconductor device supporting tape is a molding tape.

According to the present invention, a stacked plastic package is formed by stacking a plurality of plastic packages each including: a plurality of terminal members each having an outer terminal having an upper surface, a lower surface and an outer side surface, an inner terminal having a contact surface, and a connecting part connecting the outer and the inner terminal; a semiconductor device provided with terminal pads connected to the contact surfaces of the inner terminals with bond wires; and a resin molding sealing the terminal members, the semiconductor device and the bond wires therein; wherein the inner terminals of the terminal members are thinner than the outer terminals and have the contact surfaces, the contact surfaces of the inner terminals, the upper surfaces of the outer terminals, the lower surfaces of the outer terminals of the terminal members are included in planes, respectively, and the upper, the lower and the outer side surfaces of the outer terminals of the terminal members, and a surface of the semiconductor device opposite the surface provided with the terminal pads are exposed outside, and the inner terminals, the bond wires, the semiconductor device and the resin molding are included in the thickness of the outer terminals.

In the stacked plastic package according to the present invention, the lower surfaces of the outer terminals of the plastic package are connected electrically to the upper surfaces of the outer terminals of the plastic package underlying the former.

In the stacked plastic package according to the present invention, the plurality of plastic packages are arranged in a plurality of rows and stacked up in a plurality of layers.

In the stacked plastic package according to the present invention, the outer surfaces of the respective outer terminals of the laterally adjacent plastic packages are connected electrically.

The plastic package of the present invention is capable of further reducing the thickness of semiconductor parts at a low cost. Particularly, the present invention provides an efficiently mass-producible thin plastic package suitable for forming a stacked system package.

Thus, a stacked plastic package to realize a stacked system package can be provided.

A structure not provided with any die pad is formed by combining the terminal members formed by a half-etching process and having the outer terminals each having at least a thick portion of a thickness equal to that of the terminal forming sheet and the thin inner terminals thinned by half-etching, and the semiconductor device of a thickness smaller than that of the terminal forming sheet so that the surface, not provided with terminal pads, of the semiconductor device is exposed. Thus, the reduction of the thickness can be achieved by sealing the component parts including the thin semiconductor device in a space of a thickness not greater than that of the terminal forming sheet.

More concretely, the contact surfaces of the inner terminals of the terminal members are formed by half-etching, and the terminal members are extended in the same direction such that the upper and the lower surfaces of the outer terminals, and the contact surfaces of the inner terminals are included in planes, respectively, and the inner terminals extend inward. The upper, the lower and the outer side surfaces of the outer terminals serving as contact surfaces are exposed. The semiconductor device is not mounted on a die pad and is sealed in the resin molding such that the semiconductor device is spaced from the inner terminals of the terminal members, the terminal surface of the semiconductor device provided with the terminal pads faces the same direction as the half-etched surfaces of the terminal members, the lower surface of the semiconductor device opposite the terminal surface is flush with the surface opposite the half-etched surface of the terminal members, and the lower surface of the semiconductor device is exposed.

Wire bonding for connecting the terminal pads of the semiconductor device to the inner terminals facilitates connecting work and ensures the reliability of connection.

The plastic package can be efficiently mass-produced by a plastic package fabricating method of a multiple-chip fabricating system according to the present invention.

Cut parts formed in the outer side surfaces of the outer terminals facilitate separating plastic packages by dicing.

The molding step does not need any mold provided with cavities of a special shape. Semiconductor devices can be simultaneously sealed in a resin molding by holding a semiconductor device assembly between flat plates during molding. Such a molding step is suitable for mass production and is desirable from the viewpoint of equipment.

Terminal members are formed of Cu, a Cu-base alloy, or a Fe—Ni alloy containing 42% Ni.

The contact surfaces of the inner terminals, and the upper and the lower surfaces of the outer terminals of the terminal members are coated with a plated metal layer chosen from a plated solder layer, a plated gold layer, a plated silver layer, a plated palladium layer and a plated tin layer. The plated metal layer ensures reliable connection by wire bonding.

Since the lower surface not provided with any terminal pads of the semiconductor device is exposed, and the plastic package is not provided with any die pad, a resin molding covering the semiconductor device can be formed in an increased thickness, which facilitates assembly and enhances the heat dissipating ability of the plastic package.

The plastic package fabricating method according to the present invention is capable of efficiently mass-producing the thin, plastic packages of the present invention.

The stacked plastic package of the present invention constructed by stacking the plastic packages realizes a system package.

A plastic package according to the present invention includes: a plurality of terminal members each having an outer terminal having an upper surface, a lower surface and an outer side surface, and leads including inner terminals each having an upper surface and a lower surface; a semiconductor device supported by the leads and provided with terminal pads connected to the inner terminals with bond wires; and a resin package sealing the terminal members, the semiconductor device and the bond wires therein; wherein the inner terminals of the terminal members are thinner than the outer terminals, have the upper and the lower surfaces, and are included in the thickness of the outer terminals, the upper and the lower surfaces of the inner terminals and the upper and the lower surfaces of the outer terminals of the terminal members are included in planes, respectively, and the lower and the outer side surfaces of the outer terminals of the terminal members are exposed outside.

In the plastic package according to the present invention, the semiconductor device is of a center-pad type, and the leads are connected to a peripheral part of the semiconductor device.

In the plastic package according to the present invention, an additional semiconductor device provided with terminal pads connected to the inner terminals with bond wires is put on the semiconductor device.

The plastic package according to the present invention, wherein the package is formed in a flat, square shape.

In the plastic package according to the present invention, the upper surfaces of the outer terminals of each terminal member are partially exposed.

In the plastic package according to the present invention, cut parts are formed in the outer surfaces of the outer terminals of the terminal members, respectively.

In the plastic package according to the present invention, terminal members are formed of Cu, a Cu-base alloy or a Fe—Ni alloy containing 42% Ni.

In the plastic package according to the present invention, the upper and lower surfaces of the inner and the outer terminals of terminal members are coated with a plated metal layer selected from a plated solder layer, a plated gold layer, a plated silver layer, a plated palladium layer and a plated tin layer.

According to the present invention, a plastic package fabricating method includes the steps of: forming a processed sheet having at least one pair of terminal members connected to each other through a connection, each having an outer terminal, a lead including an inner terminal by subjecting a terminal forming sheet to a half-etching process; mounting a semiconductor device on the leads of the terminal members of the processed sheet; connecting the inner terminals of the terminal members of the processed sheet to the semiconductor device with bond wires; attaching a molding tape to a half-etched surface of the processed sheet and sealing the processed sheet and the semiconductor device in a resin molding by molding; and finishing a plastic package by removing the molding tape from the resin molding, attaching a cutting tape to the resin molding, and cutting parts, corresponding to the connection of the processed sheet, of the resin molding from a side opposite the side of the cutting tape.

In the plastic package fabricating method according to the present invention, the processed sheet and the semiconductor device are held between a pair of flat plates for molding to seal the processed sheet and the semiconductor device in the resin molding.

In the plastic package fabricating method according to the present invention, the processed sheet and the semiconductor device are enclosed in a space defined by a flat plate and a predetermined mold for molding to seal the processed sheet and the semiconductor device in the resin molding.

The plastic package of the present invention achieves the further miniaturization and thickness reduction of semiconductor parts at a low cost, and enables the efficient mass-production of QFN packages or SON packages.

The processed sheet is formed by a half-etching process and at least a thick portion of each of the outer terminals has a thickness equal to that of the terminal forming sheet. The terminal members include the outer terminals, and the leads including the inner terminals and formed integrally with the outer terminals, respectively. The terminal members are extended in the same direction such that the upper and lower surfaces of the outer terminals, and the contact surfaces of the inner terminals are included in planes, respectively. The terminal members are arranged near the semiconductor device with the outer terminals extending outward and the inner terminals extending inward. The plastic package has LOC construction (lead-on-chip construction), in which the lead of each terminal member lies around the terminal surface of the semiconductor device, or COL construction (chip-on-lead construction), in which the semiconductor device is mounted on the leads of the terminal members. The lower surface and the outer side surface of the thick part of each outer terminal on the side of the half-etched surface of each terminal member are exposed contact surfaces, the surfaces of the outer terminals of the terminal members are exposed partly, and the rest of the parts of the plastic package are sealed in the resin molding.

Wire bonding for connecting the terminal pads of the semiconductor device to the inner terminals facilitates connecting work and ensures the reliability of connection.

The plastic package can be efficiently mass-produced by a plastic package fabricating method of a multiple-chip fabricating system according to the present invention.

The lower and the outer side surface of the thick part of the outer terminal on the side of the half-etched surface of each terminal member having a generally flat, square shape are exposed contact surfaces, and the rest of the parts of the plastic package are sealed in the resin molding. Thus, the plastic package can be sealed in the resin molding without using any special mold during molding. The construction of the plastic package is satisfactory from the viewpoint of mass production and equipment.

The semiconductor device of a center-pad type for the LOC construction enables further thickness reduction.

Cut parts formed in the outer side surfaces of the outer terminals facilitate separating plastic packages by dicing.

Terminal members are formed of Cu, a Cu-base alloy, or a Fe—Ni alloy containing 42% Ni.

The contact surfaces of the inner terminals and the upper and lower surfaces of the outer terminals of each terminal member are coated with a plated metal layer chosen from a plated solder layer, a plated gold layer, a plated silver layer, a plated palladium layer and a plated tin layer. The plated metal layer ensures reliable connection by wire bonding.

The plastic package fabricating method of the present invention is capable of efficiently mass-producing plastic packages.

The plastic package fabricating method of the present invention is capable of efficiently mass-producing thin, plastic packages.

A plastic package according to the present invention includes: a plurality of terminal members each having an outer terminal having upper, lower and outer side surfaces, and a lead including an inner terminal having a contact surface; a die pad connected to the terminal members; a semiconductor device mounted on the die pad, and provided with terminal pads connected to the contact surfaces of the inner terminals with bond wires; and a resin molding sealing the terminal members, the die pad, the semiconductor device and the bond wires therein; wherein the inner terminal of each of the terminal members is thinner than the outer terminal, and has the contact surface, and included in the thickness of the outer terminal, the contact surfaces of the inner terminals and the upper and lower surfaces of the outer terminals of the terminal members are included in planes, respectively, the outer side surfaces of the outer terminals of the terminal members, and the lower surfaces of the leads are exposed outside.

In the plastic package according to the present invention, the upper surfaces of the outer terminals of the terminal members and the mounting surface of the die pad are included in a plane.

In the plastic package according to the present invention, an additional semiconductor device provided with terminal pads connected to the inner terminals with bond wires is put on the semiconductor device.

The plastic package is formed in a flat, square shape.

In the plastic package according to the present invention, the upper surfaces of the outer terminals of the terminal member are partially exposed.

In the plastic package according to the present invention, the outer terminals of the terminal members are provided with cut parts in their outer side surfaces, respectively.

In the plastic package according to the present invention, the terminal members are formed of Cu, a Cu-base alloy or a Fe—Ni alloy containing 42% Ni.

In the plastic package according to the present invention, the contact surfaces of the inner terminals and the upper and lower surfaces of the outer terminals of the terminal members are coated with a plated metal layer as a bonding plated layer selected from a plated solder layer, a plated gold layer, a plated silver layer, a plated palladium layer and a plated tin layer.

A plastic package fabricating method according to the present invention includes the steps of: forming a processed sheet having at least one pair of terminal members connected to each other, each having an outer terminal, a lead including an inner terminal, and a die pad by subjecting a terminal forming sheet to half-etching; mounting a semiconductor device on the die pad; connecting the inner terminals of the terminal members of the processed sheet to the semiconductor device with bond wires; attaching a molding tape to the processed sheet, and sealing the processed sheet and the semiconductor device in a resin molding by molding; and finishing a plastic package by removing the molding tape from the resin molding, attaching a cutting tape to the resin molding and cutting parts, corresponding to the connection of the processed sheet, of the resin molding from a side opposite the side of the cutting tape.

In the plastic package fabricating method according to the present invention, the processed sheet and the semiconductor device are held between a pair of flat plates for molding to seal the processed sheet and the semiconductor device in the resin molding.

In the plastic package fabricating method according to the present invention, the processed sheet and the semiconductor device are enclosed in a space defined by a flat plate and a predetermined mold for molding to seal the processed sheet and the semiconductor device in the resin molding.

The plastic package of the present invention achieves the further miniaturization and thickness reduction of semiconductor parts at a low cost, and enables the efficient mass-production of QFN or SON packages having high moisture resistance and high heat-dissipating ability.

A plastic package formed by stacking at least one semiconductor device on a semiconductor device provided with peripheral terminal pads enables forming a thin, efficiently mass-producible semiconductor part.

A package formed by stacking thin semiconductor chips in a three-dimensional arrangement and sealing the stacked thin semiconductor chips in a plastic package can realize a system LSI and can be used as a system package, such as a system-in-package (SIP).

The processed sheet is formed by a half-etching process, at least a thick portion of each of the outer terminals has a thickness equal to that of the terminal forming sheet, and the terminal member consists of the outer terminal and the lead including the inner terminal and formed integrally with the outer terminal. The die pad formed by thinning a terminal forming sheet by a half-etching process and the semiconductor device are used, the outer terminals and the inner terminals are formed such that the upper and lower surfaces of the outer terminals and the contact surfaces of the inner terminals are included in planes, respectively, and the terminal members are disposed around the semiconductor device with the outer terminals extending outward and the inner terminals extending inward. Surfaces of the leads not half-etched and the outer side surfaces of the outer terminals are exposed. Surfaces of the leads not half-etched are exposed, and the outer side surfaces and the upper surfaces of the outer terminals are partially exposed, and the rest of the component parts of the plastic package are sealed in the resin molding.

Wire bonding for connecting the terminals of the semiconductor device to the inner terminals facilitates connecting work and ensures the reliability of connection.

The plastic package can be efficiently mass-produced by a plastic package fabricating method of a multiple-chip fabricating system according to the present invention.

The plastic package according to the present invention has a flat, square shape, the surfaces of the leads not half-etched and the outer side surfaces of the outer terminals are exposed, and the rest of the component parts of the plastic package are sealed in the resin molding. The component parts of the plastic package can be simply and simultaneously sealed in the resin molding by a molding process not using any special mold. Thus, the construction of the plastic package is suitable for mass production.

More specifically, the half-etched surface of the die pad and the half-etched surfaces of the leads face opposite directions, respectively, and the surface of the die pad not half-etched and the surfaces of the outer terminals not etched are included in a plane to facilitate molding for sealing all the components of the plastic package in the resin molding simultaneously.

Since the half-etched surface of the die pad is covered with the sealing resin, the chip is rarely cracked or chipped, and the sealing resin improves moisture resistance.

The positional relation between the die pad and the terminal members enables mounting a semiconductor device greater than the die pad on the die pad.

The surfaces of the terminal members not half-etched and not on the side of the half-etched surfaces of the leads, and the outer surfaces of the outer terminals are exposed or the surfaces of the terminal members not half-etched and not on the side of the half-etched surfaces of the leads are exposed and the upper surfaces and the outer side surfaces of the outer terminals are exposed partially to enhance heat dissipation.

Cut parts formed in the outer side surfaces of the outer terminals facilitate dicing.

In the plastic package according to the present invention, the terminal member are formed of Cu, a Cu-base alloy or a Fe—Ni alloy containing 42% Ni.

In the plastic package according to the present invention, the contact surfaces of the inner terminals and the upper and the lower surfaces of the outer terminals of the terminal members are coated with a plated metal layer chosen from a plated solder layer, a plated gold layer, a plated silver layer, a plated palladium layer and a plated tin layer. The plated metal layer ensures reliable connection by wire bonding.

The plastic package fabricating method of the present invention is capable of efficiently mass-producing the plastic package of the present invention.

BEST MODE FOR CARRYING OUT THE INVENTION

First Embodiment

Preferred embodiments of the present invention will be described with reference to the accompanying drawings.

Figure 2:
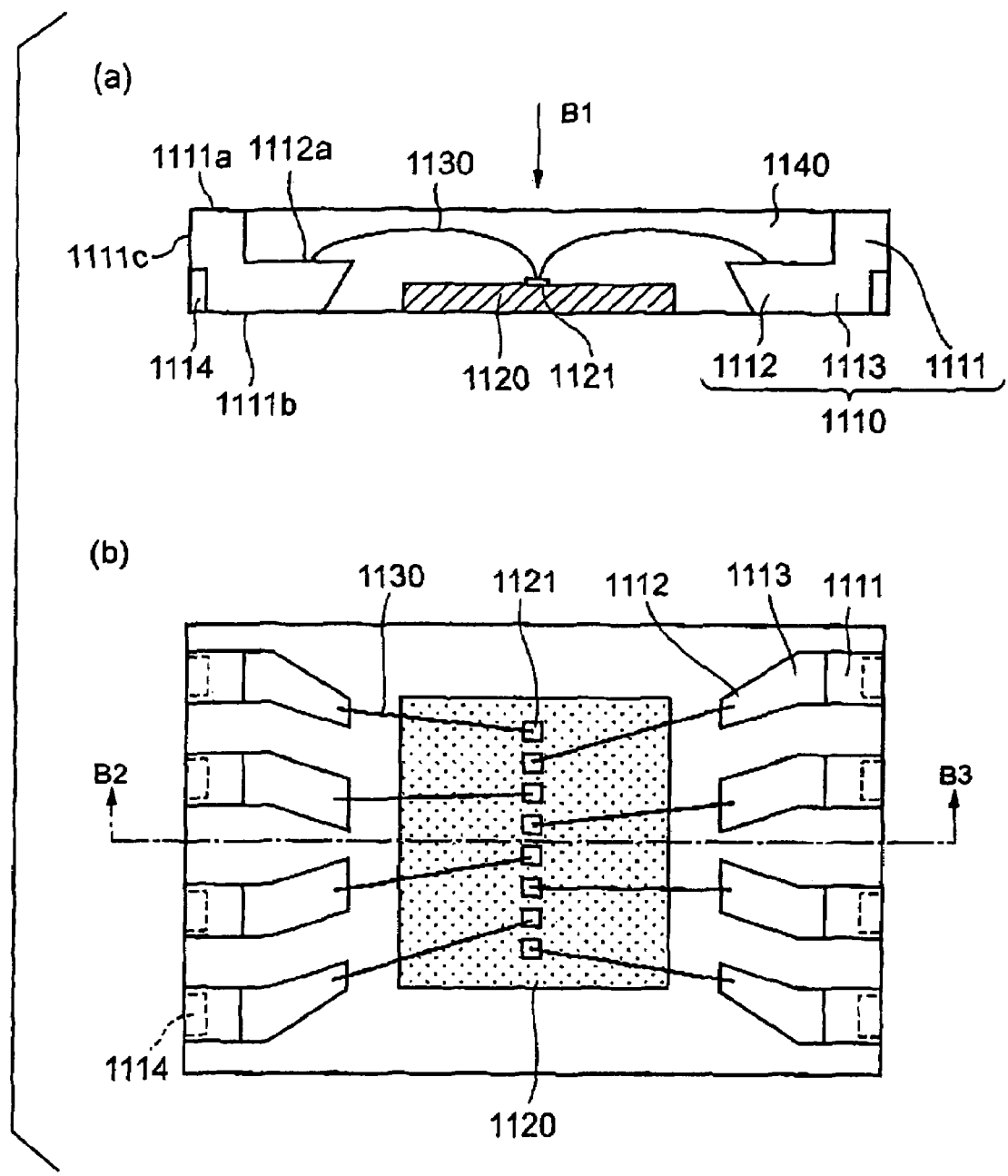
FIGS. 2(a) and 2(b) are views illustrating a plastic package in a second example of the first embodiment.
Figure 3:
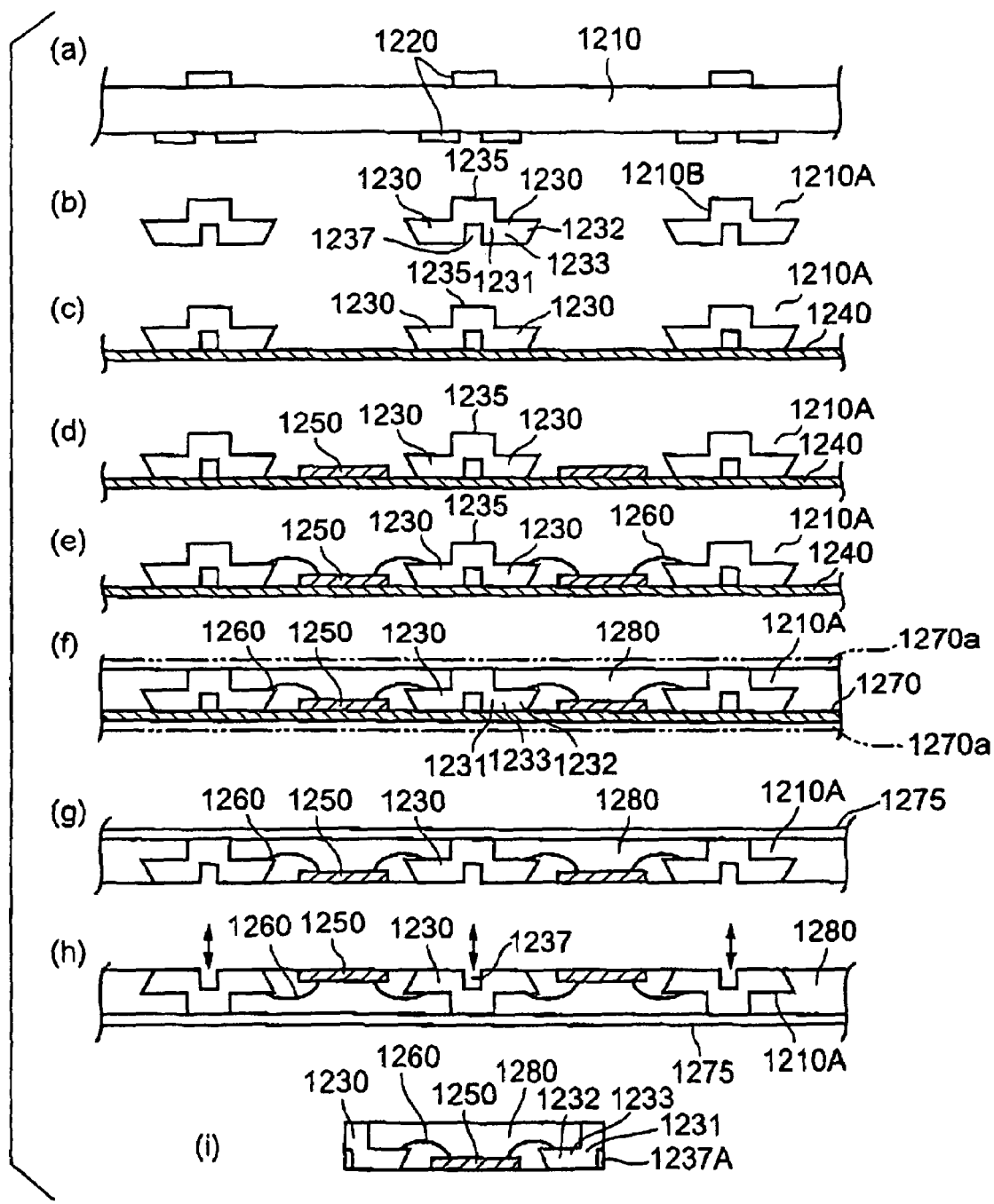
FIGS. 3(a) to 3(i) are views illustrating steps of a plastic package fabricating method in a first example according to the present invention.
Figure 4:
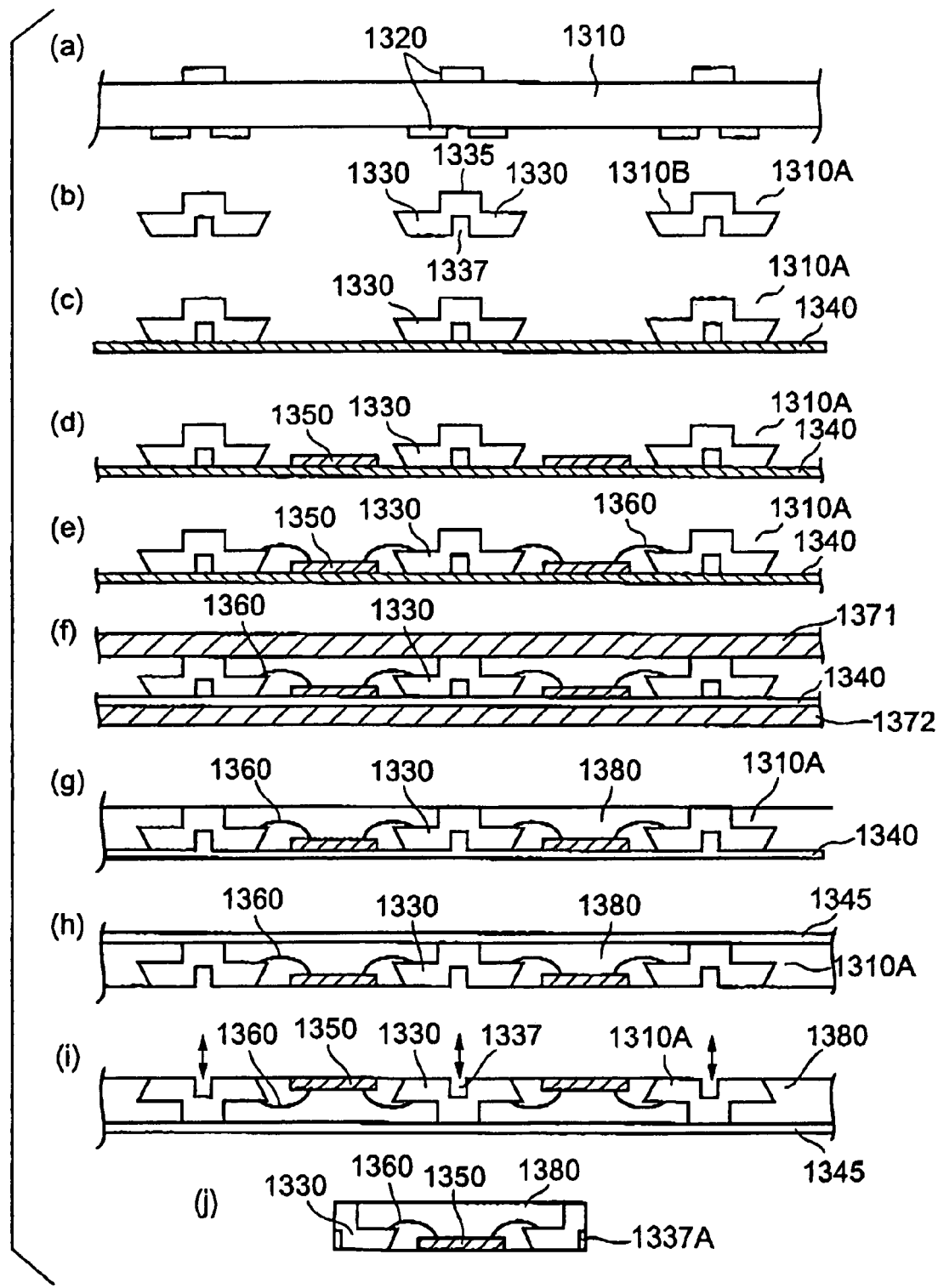
FIGS. 4(a) to 4(j) are views illustrating steps of a plastic package fabricating method in a second example according to the present invention.
Figure 5:
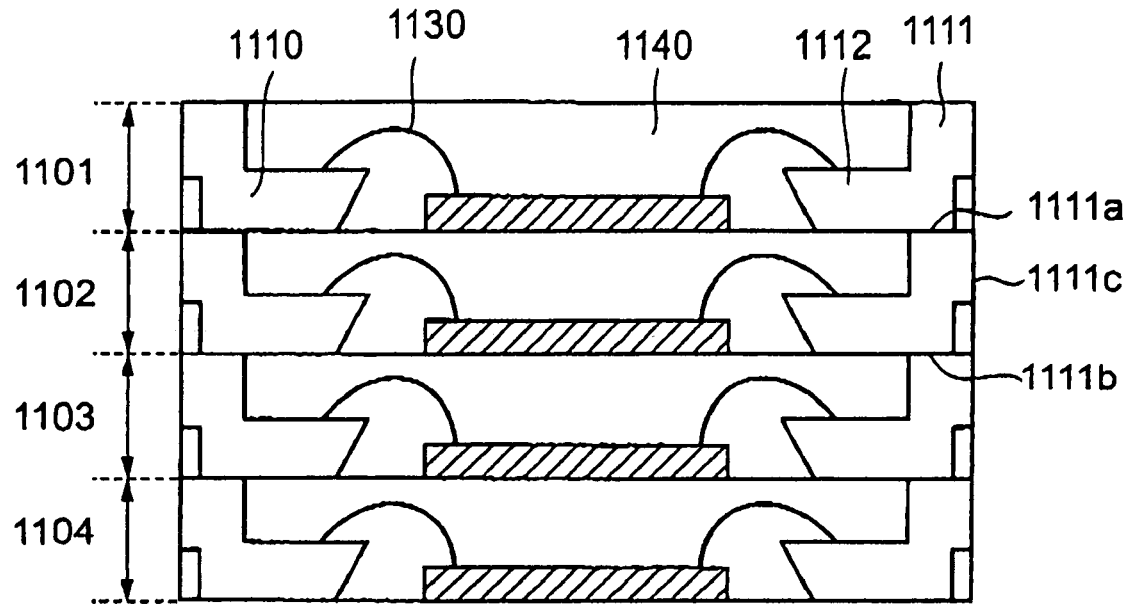
FIG. 5 is a sectional view of a stacked plastic package in a first example according to the present invention.
Figure 6:
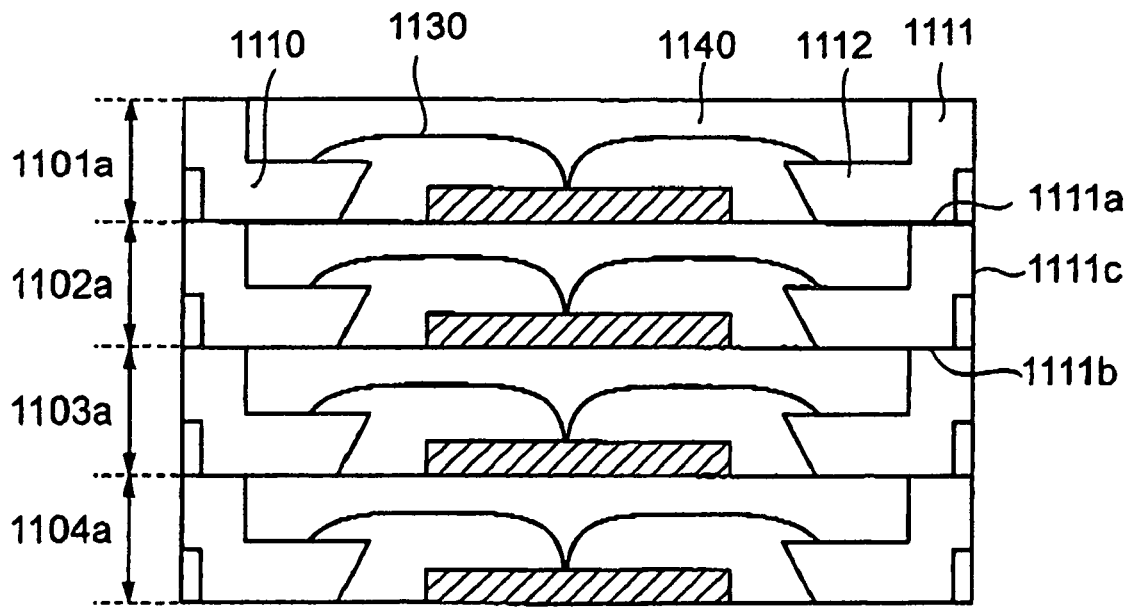
FIG. 6 is a sectional view of a stacked plastic package in a second example according to the present invention.
Figure 7:
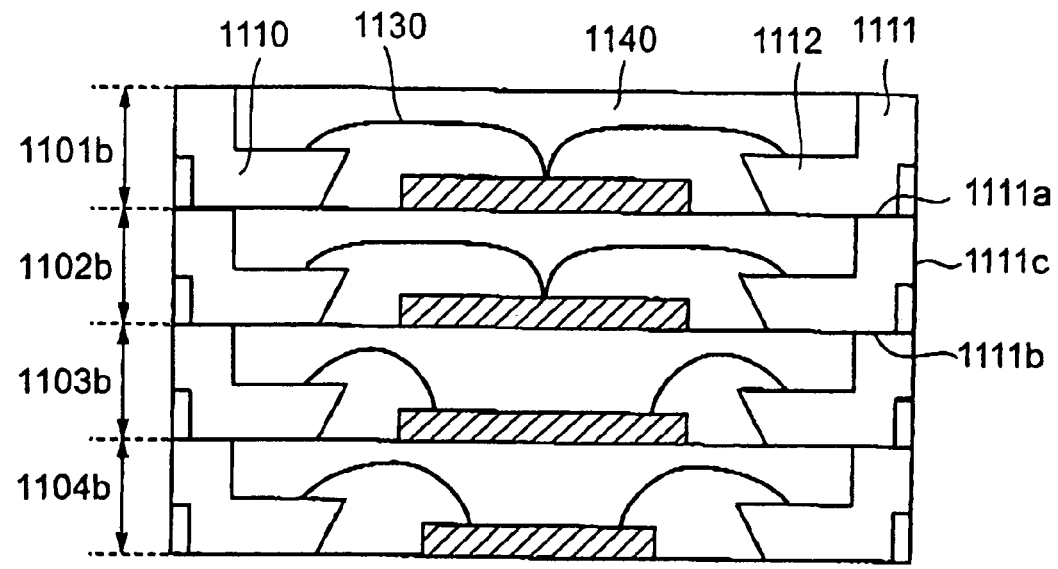
FIG. 7 is a sectional view of a stacked plastic package in a third example according to the present invention.
Figure 8:
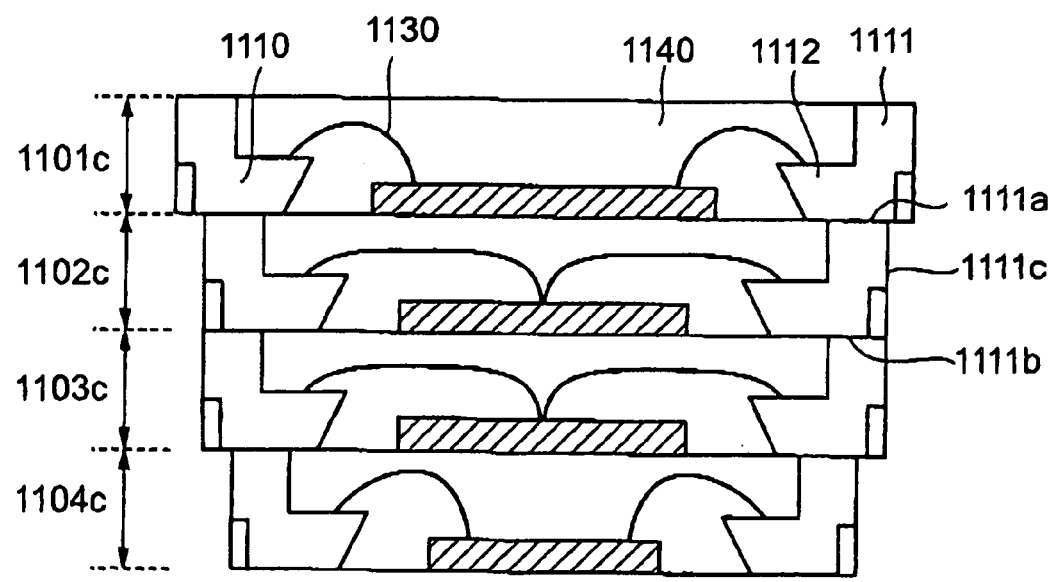
FIG. 8 is a sectional view of a stacked plastic package in a fourth example according to the present invention.
Figure 9:
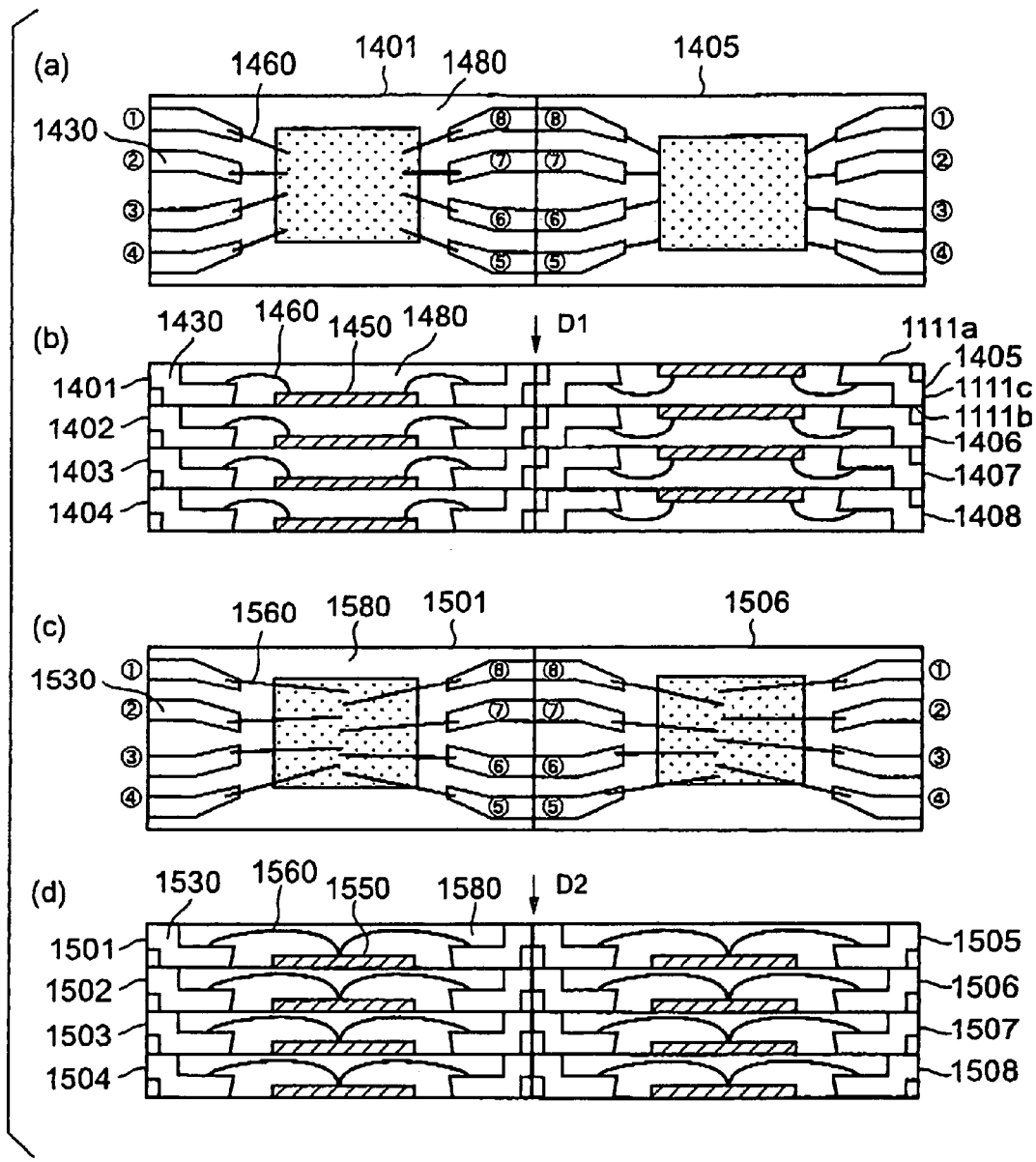
FIGS. 9(a) to 9(d) are views illustrating the stacked plastic package in the fourth example.
Figure 10:
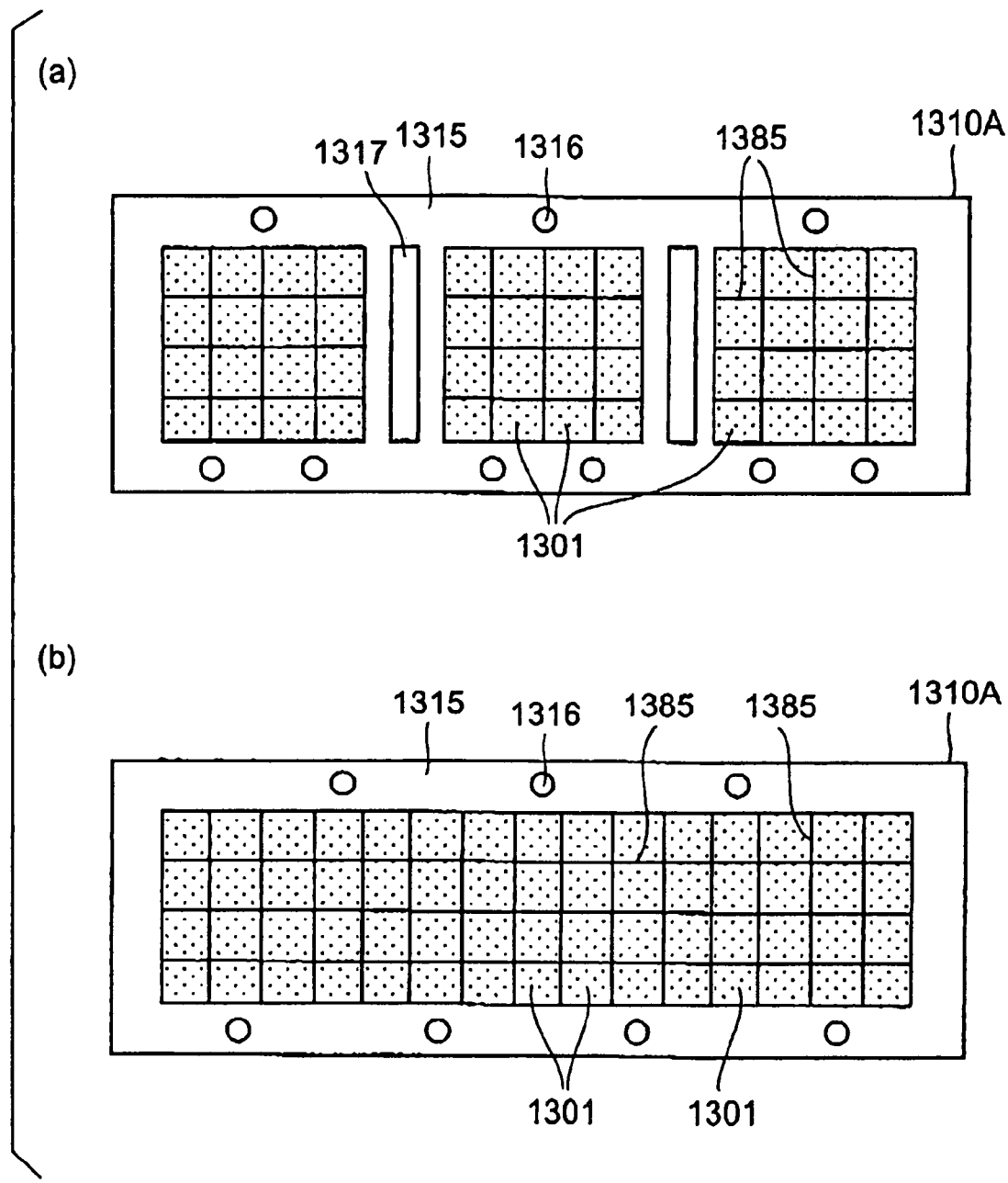
FIGS. 10(a) and 10(b) are views of assistance in explaining a dicing operation using a dicing saw.

FIG. 1(a) is a partly sectional side elevation of a plastic package in a first example of a first embodiment according to the present invention, FIG. 1(b) is a view taken in the direction of the arrow A1 in FIG. 1(a), FIG. 2(a) is a partly sectional side elevation of a plastic package in a second example of the first embodiment, FIG. 2(b) is a view taken in the direction of the arrow B1 in FIG. 2(a), FIG. 3 illustrates steps of a plastic package fabricating method in a first example according to the present invention, FIG. 4 illustrates steps of a plastic package fabricating method in a second example according to the present invention, FIG. 5 is a sectional view of a stacked plastic package in a first example, FIG. 6 is a sectional view of a stacked plastic package in a second example, FIG. 7 is a sectional view of a stacked plastic package in a third example, FIG. 8 is a sectional view of a stacked plastic package in a fourth example, FIG. 9(b) is a sectional view of the stacked plastic package in the fourth example, FIG. 9(a) is a view taken in the direction of the arrow D1 in FIG. 9(b), FIG. 9(d) is a sectional view of the stacked plastic package in the fourth example, FIG. 9(c) is a view taken in the direction of the arrow D2 in FIG. 9(d), and FIG. 10 is a view of assistance in explaining a dicing operation using a dicing saw.

FIG. 1(a) is a sectional view taken on the line $A_2$-$A_3$ in FIG. 1(b), and FIG. 2(a) is a sectional view taken on the line B2-B3 in FIG. 2(b). In FIGS. 3 to 9, terminals of a semiconductor device are omitted to facilitate understanding.

In FIGS. 3(h) and 4(i), double-headed arrows indicate directions in which a dicing saw is moved.

Shown in FIGS. 1 to 10 are plastic packages 1101 to 1104, 1101a to 1104a, 101b to 1104b and 1101c and 1104c, terminal members 1110, outer terminals 1111, contact surfaces 1111a, 1111b and 1111c, internal terminals 1112, contact surfaces (half-etched surfaces) 1112a, connecting parts 1113, notches 1114, semiconductor devices (referred to also as "semiconductor chips" or "chips") 1120, terminals (terminal pads) 1121, bond wires 1130, a resin molding 1140, a terminal forming sheet 1210, a processed sheet 1210A, a resist film 1220, terminal members 1230, outer terminals 1231, inner terminals 1232, connecting parts 1233, connection 1235, grooves 1237, cut parts 1237A, a perforated suction plate (referred to also as "suction plate") 1240, semiconductor devices 1250, bond wires 1260, a molding tape 1270, a cutting tape 1275, a resin molding 1280, a component plastic package 1301, a terminal forming sheet 1310, a processed sheet 1310A, a frame 1315, locating holes 1316, slots 1317, resist films 1320, terminal members 1330, connection 1335, grooves 1337, cut parts 1337A, a molding tape 1340, a cutting tape 1345, semiconductor devices 1350, bond wires 1360, flat molding plates 1371 and 1372, a resin molding 1380, cutting lines 1385, plastic packages 1401 to 1408, terminal members 1430, semiconductor devices 1450, bond wires 1460, plastic packages 1501 to 1508, terminal members 1530, semiconductor devices 1550, and bond wires 1560.

FIGS. 1(a) and 1(b) show a plastic package in a first example of the first embodiment.

Referring to FIGS. 1(a) and 1(b), the plastic package includes a plurality of terminal members 1110 each consisting of an outer terminal 1111, an inner terminal 1112 and a connecting part 1113 connecting the outer terminal 1111 and the inner terminal 1112, a semiconductor device 1120 provided with terminal pads 1121 connected to the inner terminals with bond wires 1130, and a resin molding 1140 sealing the terminal members 1110, the semiconductor device 1120 and the bond wires 1130 therein.

Each of the outer terminals 1111 has an upper surface 1111a, a lower surface 1111b and an outer side surface 1111c. Each of the inner terminals 1112 has a contact surface 1112a to which the bond wire 1130 is bonded.

The outer terminals 1111 are connected to external circuits. The outer terminals 1111 have a thickness equal to that of a terminal forming sheet 1210. The inner terminals 1112 are connected to the terminals of the semiconductor device 1120. The inner terminals 1112 are formed by half-etching the terminal forming sheet 1210 and have a thickness smaller than that of the terminal forming sheet 1210. The outer terminal 1111 and the inner terminal 1112 are formed integrally by an etching process to form the terminal member 1110. The thickness of the semiconductor device 1120 is smaller than that of the terminal-forming sheet 1210. the terminals 1121 of the semiconductor device 1120 are connected to the inner terminals 1112 of the predetermined terminal members 1110, respectively, with the bond wires 1130. The plastic package has a flat, square shape included in the thickness of the terminal-forming sheet 1210.

The half-etched surface of the inner terminal 1112 of each terminal member 1110 is a contact surface 1112a. The terminal members 1110 are disposed so that the surfaces 1111a and 1111b of the outer terminal 1111, and the contact surfaces 1112a of the inner terminals 1112 are included in planes, respectively. The terminal members 1110 are arranged around the semiconductor device 1120 with the outer terminals 1111 extended outward and the inner terminals 1112 extended inward. The surfaces 1111a and 1111b and the outer side surfaces 1111c of the outer terminals are exposed outside.

The semiconductor device 1120 is spaced apart from the inner terminals 1112. The terminal surface of the semiconductor device 1120 on the side of the terminals 1121 faces the same direction as the half-etched surfaces of the terminal members 1110. The back surface 1120a opposite the terminal surface of the semiconductor device 1120 faces the same direction as the surfaces opposite the half-etched surfaces of the terminal members 1110. The semiconductor device 1120 is not mounted on a die pad and the back surface 1120a of the semiconductor device 1120 is exposed. The semiconductor device 1120 is packaged in a resin molding 1140.

This plastic package is not provided with any die pad. the back surface 1120a opposite the terminal surface provided with the terminals 1121 of the semiconductor device 1120 is exposed. All the components of the plastic package included in the thickness of the terminal-forming sheet are sealed in the resin molding 1140. The semiconductor device 1120 is thin. For example, when the semiconductor device 1120 has a thickness in the range of 0.025 to 0.1 mm, the thickness of the terminal forming sheet 1210 forming the terminal members 1110 may be 0.2 mm.

Wire bonding for connecting the terminals facilitates connecting work and ensures the reliability of connection.

The plastic package can be efficiently mass-produced by a plastic package fabricating method of a multiple-chip fabricating system according to the present invention, which will be described later.

A molding step for sealing the component parts in the resin molding does not need any cavity of a special shape. The component parts need to be held simply between flat plates for molding. Thus, the construction of the plastic package is desirable from the viewpoint of equipment.

Materials suitable for forming the terminal members 1110 are Cu, a Cu-base alloy, or a Fe—Ni alloy containing 42% Ni. Generally, Cu or a Cu-base alloy is used owing to its high conductivity and desirable properties.

The outer side surfaces 1111c of the outer terminals 1111 are the cut edges of the terminal forming sheet 1210. The surfaces 1111a and 1111b are coated with a connecting plated layer.

The connecting plated layer is a plated metal layer chosen from a plated solder layer, a plated gold layer, a plated silver layer, a plated palladium layer and a plated tin layer.

Usually, the resin molding 1140 is formed of an epoxy resin. The resin molding 1140 may be formed of any suitable resin other than the epoxy resin.

A plastic package in a second example of the first embodiment will be described with reference to FIG. 2.

The plastic package in the second example, similarly to the plastic package in the first example, is provided with terminal members 1110 formed by half-etching a terminal forming sheet 1210 and each consisting of an outer terminal 1111 of a thickness equal to that of the terminal forming sheet 1210 to be connected to an external circuit, and an inner terminal 1112 of a thickness smaller than that of the terminal forming sheet 1210 to be connected to a semiconductor device 1120. The inner terminal 1112 is formed integrally with the outer terminal 1111. The semiconductor device 1120 is thinner than the terminal-forming sheet 1210. Terminals 1121 of the semiconductor device 1120 are connected to the inner terminals 1112 of the predetermined terminal members 1110, respectively, with bond wires 1130 by wire bonding. Components of the plastic package are included in the thickness of the terminal-forming sheet 1210, and the plastic package has a flat, square shape of a thickness equal to that of the terminal-forming sheet 1210. The terminals 1121 of the semiconductor device 1120, differing from the terminals 1121 of the semiconductor device 1120 of the first example arranged in two lines as shown in FIGS. 1(a) and 1(b), are arranged in a single line in a middle part of the upper surface of the semiconductor device 1120.

The plastic package shown in FIGS. 2(a) and 2(b) is the same in other respects as the plastic package shown in FIGS. 1(a) and 1(b).

Although the terminal members 1110 are arranged along the opposite sides of the semiconductor device 1120 in the plastic package shown in FIGS. 2(a) and 2(b), the terminal members 1110 may be arranged in any other suitable arrangement.

In plastic packages in modifications of the plastic packages in the first and the second example, a semiconductor device 1120 is provided with terminal pads 1121 arranged along the four sides of the upper surface thereof, and terminal members 1110 are arranged along the four sides of the semiconductor device 1120.

Four plastic packages of the same size, for example, similar to the plastic package in the first example shown in FIGS. 1(a) and 1(b) are stacked up to build a stacked plastic package as shown in FIG. 5.

Four plastic packages of the same size, for example, similar to the plastic package in the second example shown in FIGS. 2(a) and 2(b) are stacked up to build a stacked plastic package as shown in FIG. 6.

In those stacked plastic packages, the lower surfaces 1111b of the outer terminals 1111 of the plastic package are connected electrically to the upper surfaces 1111a of the outer terminals 1111 of the plastic package underlying the former.

A stacked plastic package as shown in FIG. 7 may be built by stacking plastic packages of the same size including those similar to the plastic package in the first example and those similar to the plastic package in the second example.

A stacked plastic package as shown in FIG. 8 may be built by stacking plastic packages similar to the plastic package in the first example and those similar to the plastic package in the second example respectively having different sizes.

A stacked plastic package as shown in FIGS. 9(a) and 9(b) may be built by using eight plastic packages 1401 to 1408 of the same size similar to the plastic package in the first example. The stacked plastic package is built by stacking four planar combinations of the plastic packages 1401 to 1408 formed by combining the two symmetrical plastic packages 1401 and 1405, the two symmetrical plastic packages 1402 and 1406, the two symmetrical plastic packages 1403 and 1407, and the two symmetrical plastic packages 1404 and 1408 with the corresponding outer side surfaces 1111c of the outer terminals 1111 electrically connected.

A stacked plastic package as shown in FIGS. 9(c) and 9(d) may be built by using eight plastic packages 1501 to 1508 of the same size similar to the plastic package in the second example. The stacked plastic package is built by stacking four planar combinations of the plastic packages 1501 to 1508 formed by combining the two symmetrical plastic packages 1501 and 1505, the two symmetrical plastic packages 1502 and 1506, the two symmetrical plastic packages 1503 and 1507, and the two symmetrical plastic packages 1504 and 1508 with the corresponding outer side surfaces 1111c of the outer terminals 1111 electrically connected.

The outer side surfaces 1111c of the corresponding outer terminals 1111 are connected electrically with a conductive paste.

In FIGS. 9(a), 9(b), 9(c) and 9(d), for example, the outer terminals 1111 denoted by ① are power terminals, those denoted by ② are grounding terminals, those denoted by ③ to ⑦ are I/O terminals and those denoted by ⑧ are switching terminals. The outer side surfaces 1111c of the outer terminals 1111 are connected properly and the inner terminals are contended properly to the terminals of the semiconductor devices by wire bonding to form a desired circuit.

The number of the stacked combinations of the plastic packages is not limited to four.

A composite plastic package may be a planar combination of three plastic packages similar to the plastic package in the first or the second example formed by electrically connecting the outer side surfaces 1111c of the outer terminals 1111 thereof. A stacked plastic package may be built by stacking two or more planar combinations each of three plastic packages similar to the plastic package in the first or the second example formed by electrically connecting the outer side surfaces 1111c of the outer terminals 1111 thereof.

A stacked plastic package may be formed by stacking the plastic packages and electrically connecting the outer side surfaces 1111c of the respective outer terminals 1111 of the vertically adjacent plastic packages.

A plastic package fabricating method in a first example according to the present invention will be described with reference to FIG. 3.

Resist films 1220 respectively having predetermined patterns are formed on the opposite surfaces of a terminal forming sheet 1210 as shown in FIG. 3(a). Both the surfaces of the terminal forming sheet 1210 are etched to form pairs of terminal members 1230 for a plurality of semiconductor devices as shown in FIG. 3(b) Each pair of terminal members 1230 are connected by a connecting part 1235.

Thus, a processed sheet 1210A having the pairs of terminal members 1230 for a plurality of plastic packages is formed. Each pair of terminal members 1230 has a connecting part 1235 connecting the two terminal members 1230.

The terminal forming sheet 1210 is a sheet of Cu, a Cu-base alloy, a Fe—Ni alloy containing 42% Ni or the like. A ferric chloride solution is used as an etchant.

There is not particular restrictions on the resist films 1220, provided that the resist films 1220 are capable of withstanding the etching action of the etchant, of being patterned in a desired resolution and of being easily processed.

The resist films 1220 are removed from the processed sheet 1210A, the processed sheet 1210A is subjected to processes including a cleaning process. Then, the processed sheet 1210A is coated entirely with a plated layer 1210B for connection. Then, processed sheet 1210A is held on a perforated suction plate (semiconductor device mounting tape) 1240 by suction with the lower surface opposite the half-etched upper surface thereof in close contact with the perforated suction plate 1240 as shown in FIG. 3(c). Then, a predetermined number of semiconductor devices 1250 are located at predetermined positions, respectively, and are mounted on the perforated suction plate 1240 by suction with the back surface opposite the surface provided with terminal pads 1121 in close contact with the perforated suction plate 1240 as shown in FIG. 3(d). The semiconductor devices 1250 are held in place on the perforated suction plate 1240 by suction.

A suction system including a vacuum pump, a suction pipe and such, not shown, is connected to the perforated suction plate 1240.

Then, the terminals 1121 of the semiconductor devices 1250 are connected to the half-etched contact surfaces of the inner terminals 1112 of the terminal members 1230 with bond wires 1260, respectively, as shown in FIG. 3(e).

Then, the processed sheet 1210A is separated from the perforated suction plate 1240, a molding tape 1270 is attached to the lower surface opposite the half-etched upper surface of the processed sheet 1210A with the back surfaces of the semiconductor devices 1250 firmly bonded to the molding tape 1270. The processed sheet 1210A is held between a pair of flat molding plates 1270a, and then the processed sheet 1210A held between the pair of flat molding plates 1270a is sealed in a resin molding 1280 by molding. Then, the molding plates 1270a are removed as shown in FIG. 3(f).

The connecting parts 1235 connecting the terminal members 1230 of the processed sheet 1210A are provided with through holes. A resin for forming packages flows through the through holes of the connecting parts 1235 during a molding process.

Then, the molding tape 1270 is removed from the resin molding 1280, and a cutting tape 1275 is applied to the resin molding 1280 as shown in FIG. 3(g). Then, the resin molding 1280 is cut from a side opposite the side of the cutting tape 1275 with a dicing saw, not shown, as shown in FIG. 3(h) to obtain individual plastic packages as shown in FIG. 3(i).

As shown in FIG. 3(h), thin parts of the processed sheet corresponding to grooves 1237 are cut with the dicing saw.

The resin molding is cut with the dicing saw, not shown, along cutting lines, for example, shown in FIG. 10(a) or 10(b).

In FIG. 10, individual plastic packages 1301 are demarcated by cutting lines 1385 corresponding to the grooves 1237 formed in the connections 1235 shown in FIG. 3.

The processed sheet 1310A is called also a frame.

The cut surfaces of the processed sheet 1310A are the outer side surfaces of the outer terminals of the plastic packages.

Surfaces of the cut parts 1237A other than the cut surfaces are plated and can be easily used for connection.

Figure 1:
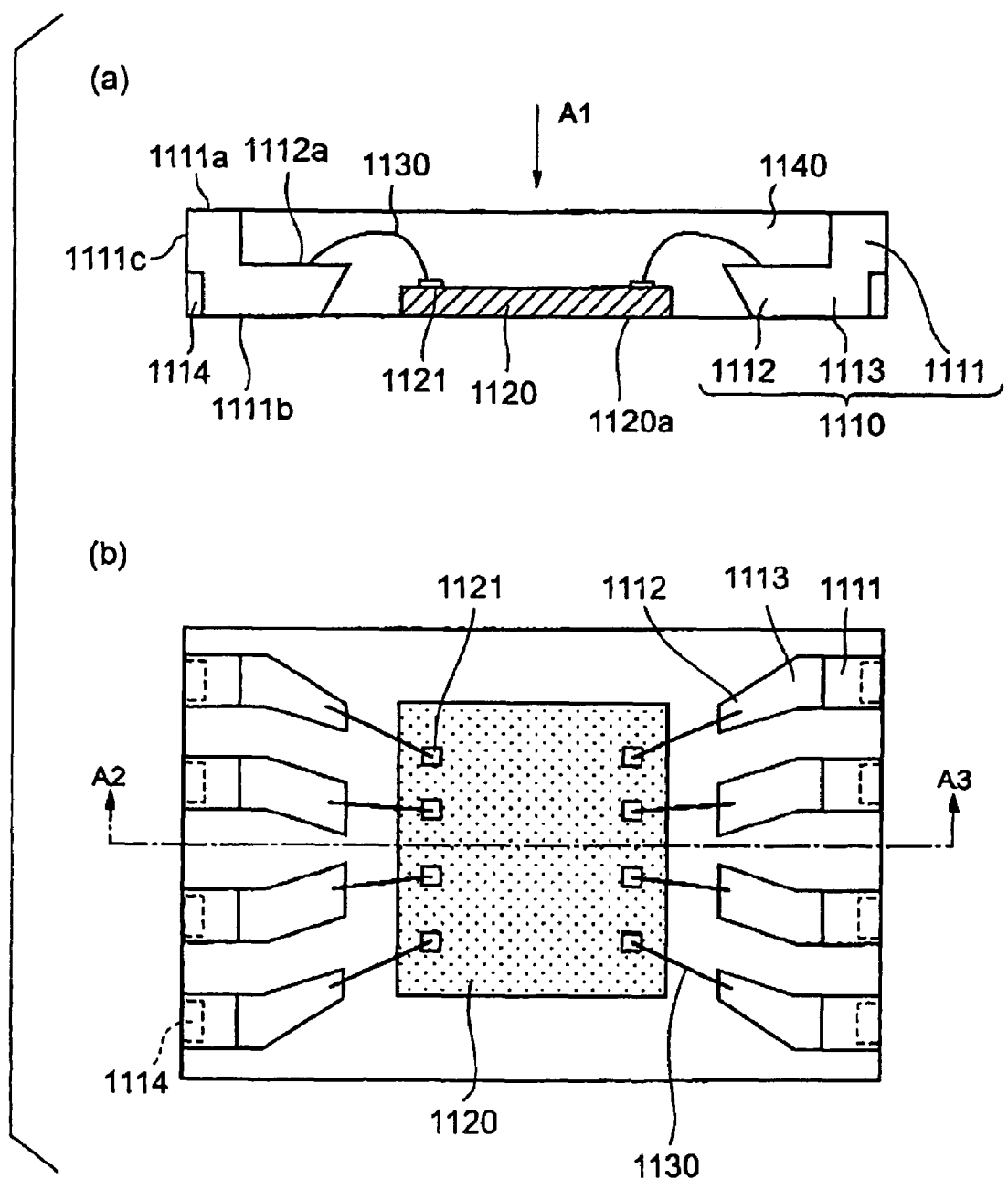
FIGS. 1(a) and 1(b) are views illustrating a plastic package in a first example of a first embodiment according to the present invention.

The plastic package in the first example shown in FIG. 1 is thus fabricated.

A plastic package fabricating method in another example according to the present invention will be described with reference to FIG. 4.

Resist films 1320 respectively having predetermined patterns are formed on the opposite surfaces of a terminal forming sheet 1310 as shown in FIG. 4(a). Both the surfaces of the terminal forming sheet 1310 are etched to form pairs of terminal members 1330 for a plurality of semiconductor devices as shown in FIG. 4 (b) Each pair of terminal members 1330 are connected by a connecting part 1335.

Thus, a processed sheet 1310A having the pairs of terminal members 1330 for a plurality of plastic packages is formed. Each pair of terminal members 1330 has a connection 1335 connecting the two terminal members 1330.

Then, the resist films 1320 are removed form the processed sheet 1310A, the processed sheet 1310A is subjected to processes including a cleaning process. Then, the processed sheet 1310A is coated entirely with a plated layer 1310B for connection. Then, a molding tape (semiconductor device mounting tape) 1340 is applied to the lower surface opposite the half-etched upper surface of the processed sheet 1310A as shown in FIG. 4(c). Then, a predetermined number of semiconductor devices 1350 are located at predetermined positions, respectively, and are mounted on the mounted on the molding tape 1340 with the back surface opposite the surface provided with terminal pads 1121 in close contact with the molding tape 1340 as shown in FIG. 4(d)

Then, the terminals 1121 of the semiconductor devices 1350 are connected to the half-etched contact surfaces of the inner terminals 1112 of the terminal members 1330 with bond wires 1360, respectively, as shown in FIG. 4(e).

Then, the processed sheet 1310A is held between flat molding plates 1371 and 1372, and the assembly of the processed sheet 1310A and the semiconductor devices 1350 is sealed in a resin molding 1380 by molding as shown in FIG. 4(f).

Then, the molding plates 1371 and 1372 are removed from the resin molding 1380 as shown in FIG. 4(g). The mounting tape 1340 is removed and a cutting tape 1345 is applied to the resin molding 1380 as shown in FIG. 4(h). Then, the resin molding 1380 is cut from a side opposite the side of the cutting tape 1345 with a dicing saw, not shown, as shown in FIG. 4(i) to obtain individual plastic packages as shown in FIG. 3(j).

The plastic package fabricating method illustrated by FIG. 4 is basically the same as that illustrated by FIG. 3 in processes and parts and hence further description thereof will be omitted.

The plastic package in the first example shown in FIG. 1 can be fabricated by any one of those plastic package fabricating methods.

As apparent from the foregoing description, the present invention provides a thin plastic package suitable for mass production and capable of being manufactured at a low cost. The present invention provides also a stacked plastic package built by staking thin plastic packages. Thus, the so-called stacked system package can be realized. The present invention provides a plastic package fabricating method of fabricating such a thin plastic package.

Second Embodiment

A second embodiment of the present invention will be described.

Figure 18:
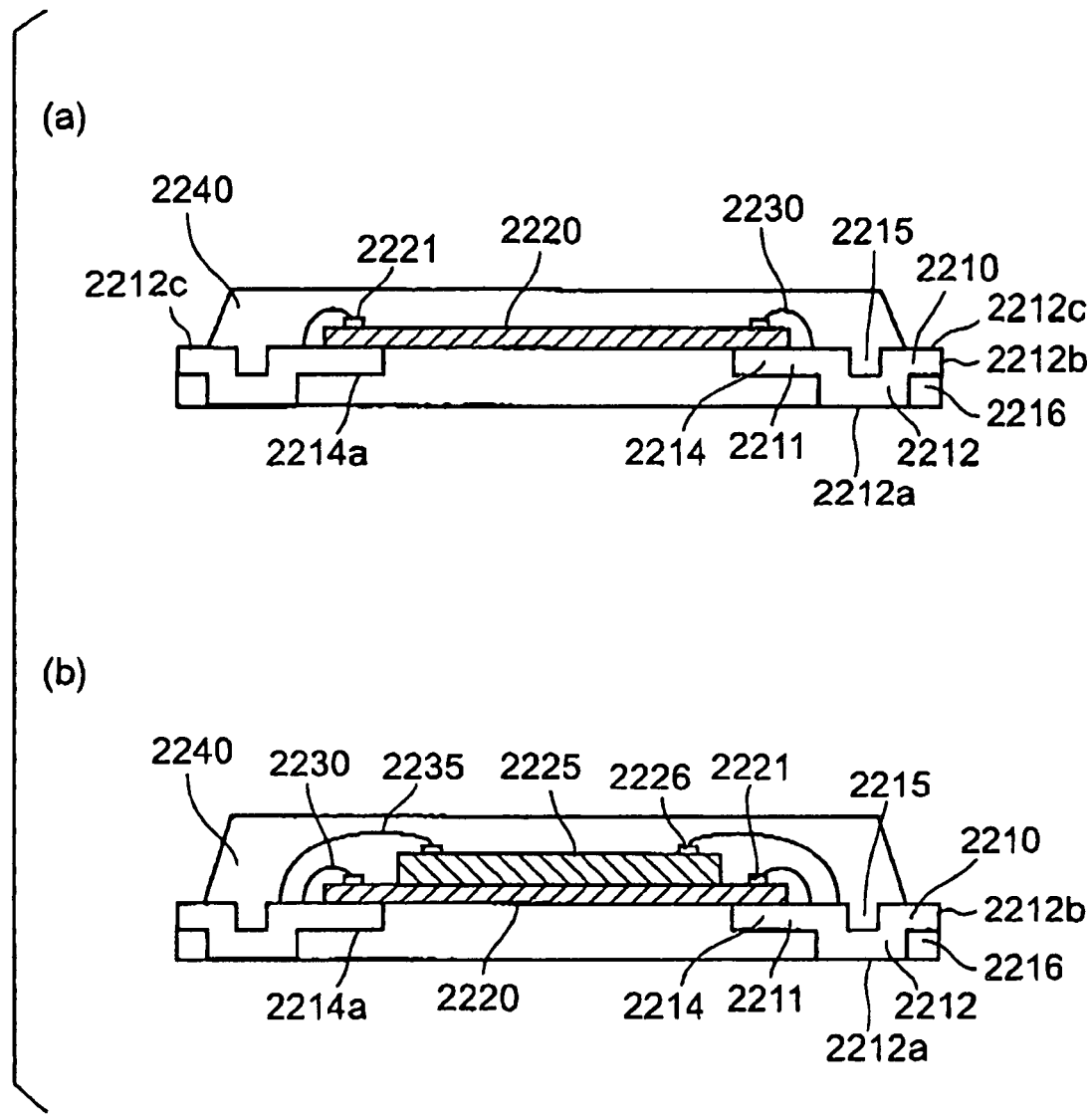
FIGS. 18(a) and 18(b) are views illustrating plastic packages in modifications of the plastic packages in the fifth and the sixth example, respectively.
Figure 19:
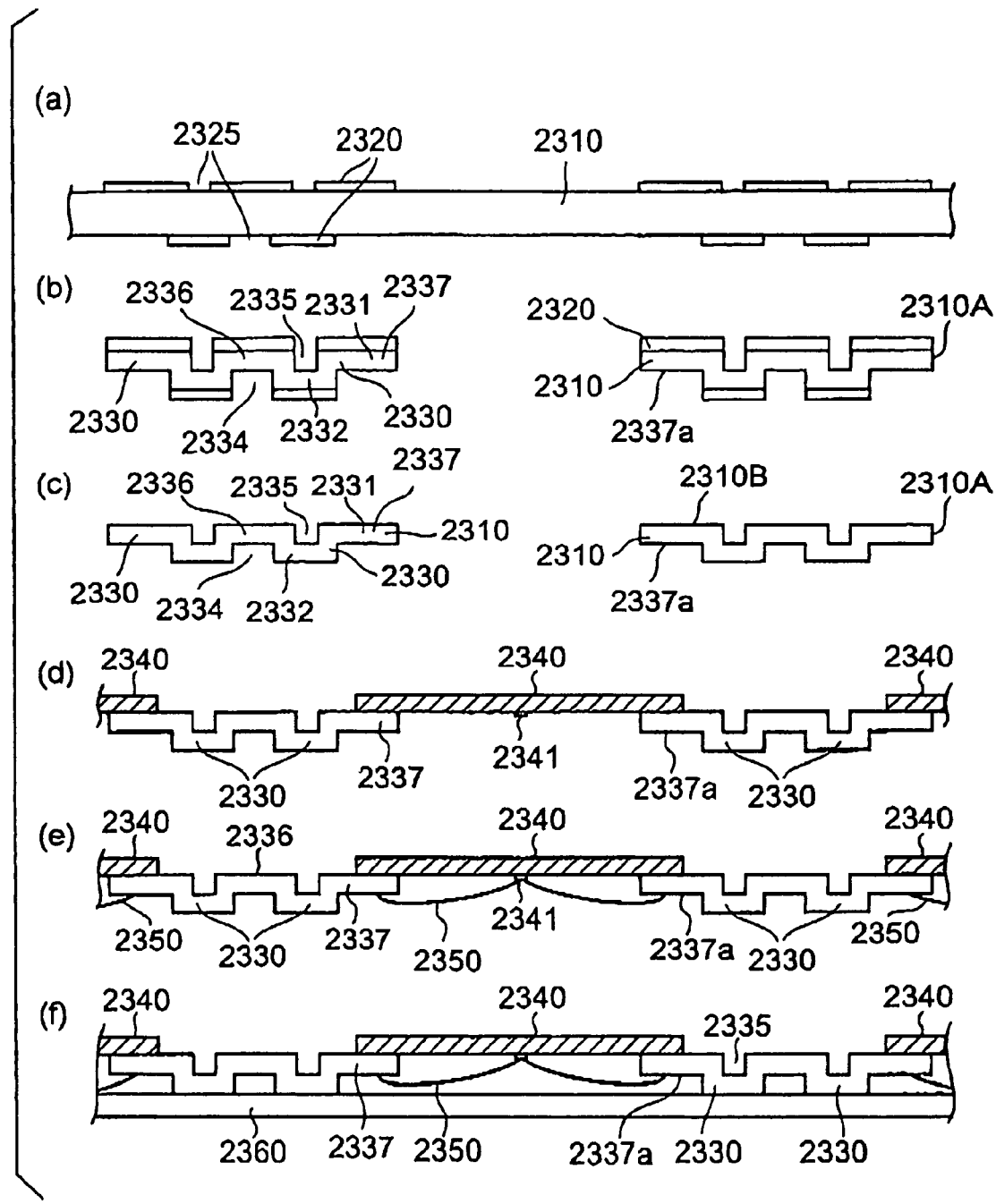
FIGS. 19(a) to 19(f) are views illustrating steps of a plastic package fabricating method in an example.
Figure 20:
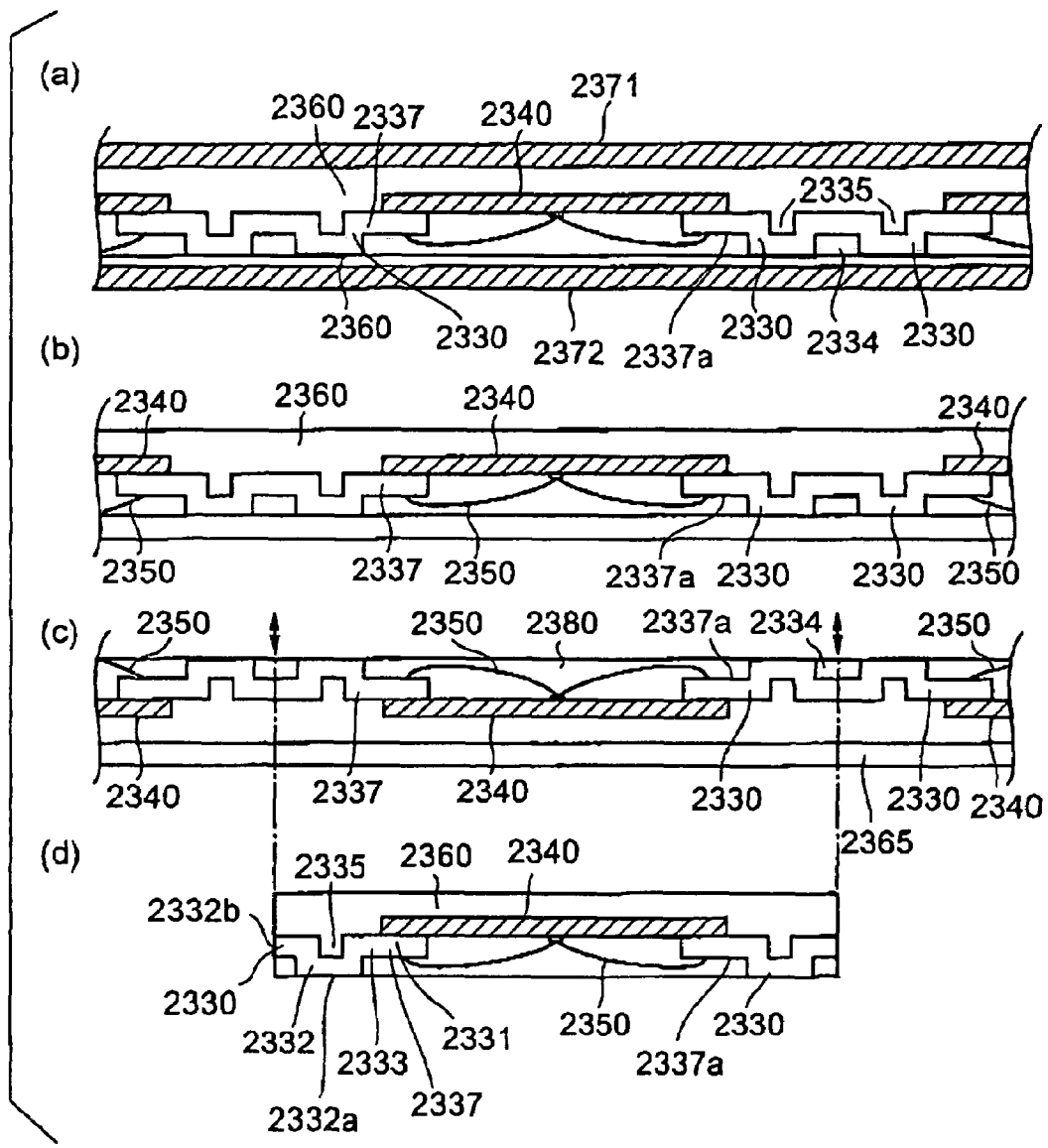
FIGS. 20(a) to 20(d) are views illustrating steps following the steps illustrated in FIGS. 19(a) to 19(f)
Figure 21:
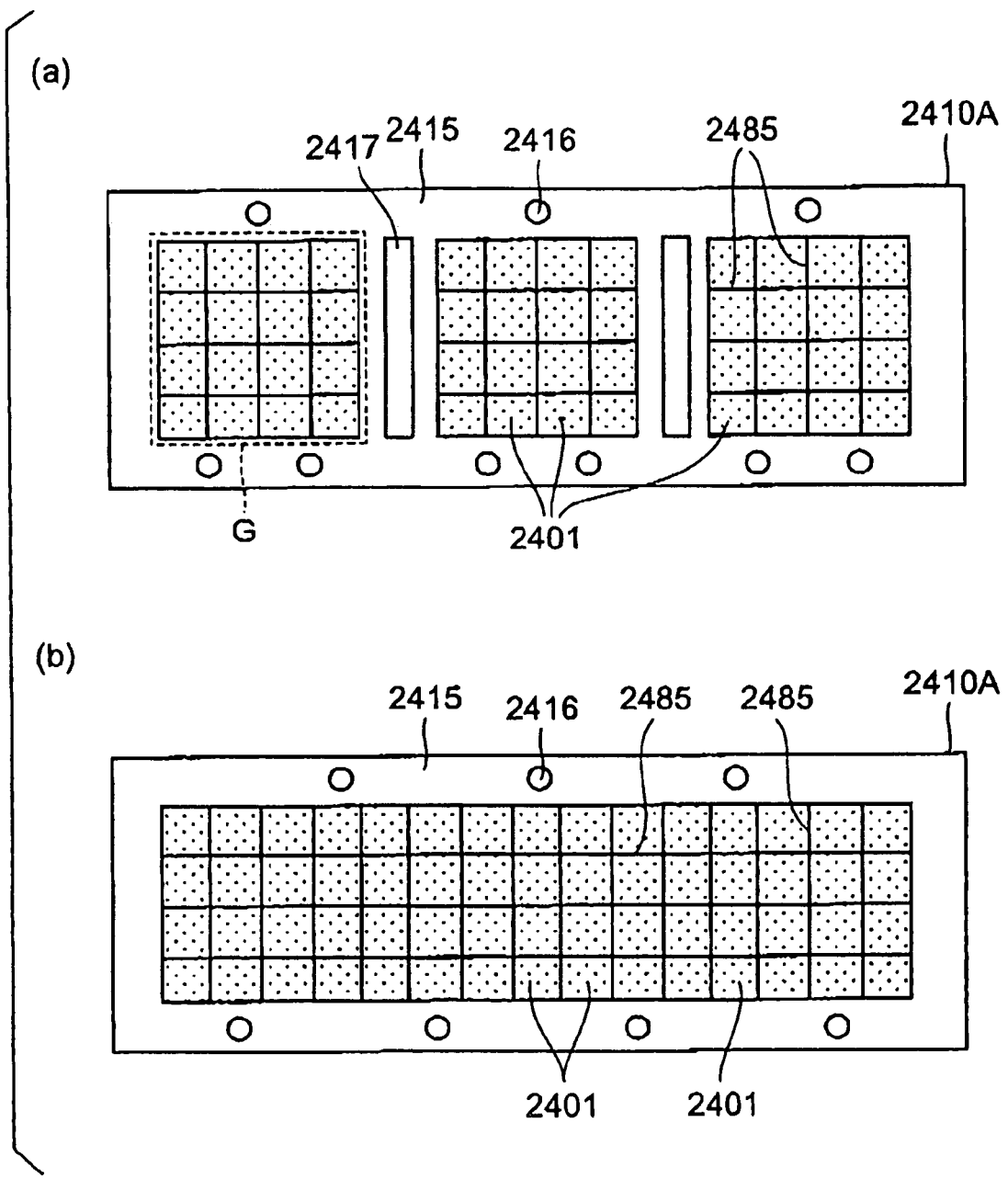
FIGS. 21(a) and 21(b) are views of assistance in explaining a dicing operation using a dicing saw.

FIG. 11(a) is a sectional view of a plastic package in a first example of a second embodiment according to the present invention , FIG. 11(b) is a view taken in the direction of the arrow A1 in FIG. 11(a), FIG. 12(a) is a sectional view of a plastic package in a second example of the second embodiment, FIG. 12(b) is a view taken in the direction of the arrow B1 in FIG. 12(a), FIG. 13(a) is a sectional view of a plastic package in a third example of the second embodiment, FIG. 13(b) is a view take in the direction of the arrow C1 in FIG. 13(a), FIG. 14(a) is a sectional view of a plastic package in a fourth example of the second embodiment, FIG. 14(b) is a view take in the direction of the arrow D1 in FIG. 14(a), FIGS. 15(a), 15(b) and 15(c) are views of plastic packages in modifications of the first, the second and the third example, respectively, FIG. 16(a) is a sectional view of a plastic package in a fifth example of the second embodiment, FIG. 16(b) is a view take in the direction of the arrow E1 in FIG. 16(a), FIG. 17(a) is a sectional view of a plastic package in a sixth example of the second embodiment, FIG. 17(b) is a view take in the direction of the arrow F1 in FIG. 17(a), FIGS. 18(a) and 18(b) are sectional views of plastic packages in modifications of the plastic packages in the fifth and the sixth example, respectively, FIG. 19 is sectional views illustrating the steps of plastic package fabricating method in an example according to the present invention, FIG. 20 is sectional views illustrating steps following those illustrated by FIG. 19, and FIG. 21 is a view of assistance in explaining a dicing operation.

FIG. 11(a) is a sectional view taken on the line A2-A3 in FIG. 11(b), FIG. 12(a) is a sectional view taken on the line B2-B3 in FIG. 12(b), FIG. 13(a) is a sectional view taken on the line C2-C3 in FIG. 13(b), FIG. 14(a) is a sectional view taken on the line D2-D3 in FIG. 14(b), FIG. 16(a) is a sectional view taken on the line E2-E3 in FIG. 16(b), and FIG. 17(a) is a sectional view taken on the line F2-F3 in FIG. 17(b).

Double-headed arrows in FIG. 20(c) indicate directions in which a dicing saw is moved.

Shown in FIGS. 11 to 21 are terminal members 2110, inner terminals 2111, outer terminals 2112, contact surfaces 2112a and 2112b, connecting parts 2113, leads 2114, half-etched surfaces 2114a, grooves 2115, cut parts 2116, semiconductor devices (referred to also as "semiconductor chips" or "chips") 2125 and 2125A, contact surfaces 2125a, terminals 2126, bond wires 2130, 2135 and 2135A, a resin molding 2140, terminal members 2210, inner terminals 2211, outer terminals 2212, contact surfaces 2212a and 2212b, leads 2214, half-etched surfaces 2214a, grooves 2215, cut parts 2216, semiconductor devices (referred to also as "semiconductor chips" or "chips") 2220, contact surfaces 2220a, terminals 2221, semiconductor devices (referred to also as "semiconductor chips" or "chips") 2225, contact surfaces 2225a, terminals 2226, bond wires 2230 and 2235, a resin molding 2240, a terminal forming sheet 2310, a processed sheet 2310A, resist films 2320, openings 2325, terminal members 2330, inner terminals 2331, outer terminals 2332, grooves 2334, cut parts 2334A, grooves 2335, connections 2336, leads 2337, half-etched surfaces 2337a, semiconductor devices 2340, terminal pads 2341, bond wires 2350, a molding tape 2360, a cutting tape 2365, flat molding plates 2371 and 2372, a resin molding 2380, component plastic packages 2401, a processed sheet 2410A, a frame 2415, locating holes 2416, slots 2417 and cutting lines 2485.

FIGS. 11(a) and 11(b) illustrate a plastic package in a first example. Referring to FIGS. 11(a) and 11(b), the plastic package has a plurality of terminal members 2110 consisting of outer terminals 2112, and leads 2114 including inner terminals 2111, a semiconductor device 2120 provided with terminal pads 2121 connected to the inner terminals 2111 with bond wires 2130, and a resin molding 2140 sealing the terminal members 2110, the semiconductor device 2120 and the bond wires 2130 therein. Each of the outer terminals 2112 has an upper surface 2112c, a lower surface 2112a and an outer side surface 2112b. Each of the inner terminals 2111 has an upper surface 2114b and a lower surface 2114a.

The outer terminals 2112 to be connected to external circuits, and the leads 2114 including the inner terminals 2111 to be connected to the semiconductor device 2120 are connected integrally to form the terminal members 2110. A terminal forming sheet 2310 is processed by a half-etching process to form the outer terminals 2112 respectively having thick portions of a thickness equal to that of the terminal forming sheet 2310, and the leads 2114 thinner than the terminal forming sheet 2310. The semiconductor device 2120 is of a center-pad type. The terminals (terminal pads) 2121 of the semiconductor device 2120 are connected to the inner terminals 2111 of the predetermined terminal members 2110 with bond wires 2130, respectively. The assembly of the semiconductor device 2120, the terminal members 2110 and the bond wires 2130 is sealed in a resin to form a flat, square plastic package.

All the upper surfaces 2112c of the outer terminals 2112, all the lower surfaces 2112a of the outer terminals 2112, and the etched surfaces (the lower surfaces of the inner terminals) of the leads 2114a are included in planes, respectively. The terminal members 2110 are arranged near the semiconductor device 2120 with the outer terminals 2112 extending outward and the inner terminals 2111 extending inward. The lower surfaces 2114a of the inner terminals 2111 are etched surfaces 2114a. The plastic package is a LOC (lead-on-chip) plastic package, in which the semiconductor device 2120 is mounted on the inner terminals 2111 with its terminal surface 2120a in contact with the upper surfaces 2114b of the leads 2114 opposite the half-etched surfaces 2114a, i.e., the upper surfaces of the inner terminals 2111. The lower surfaces 2112a (contact surfaces 2112a) of thick portions of the outer terminals 2112 on the side of the half-etched surfaces 2114a of the terminal members 2110, and the outer side surfaces 2112b (contact surfaces 2112b) of the outer terminals 2112 are exposed outside, and the rest of the component parts are sealed in the resin molding 2140.

The plastic package in the first example can be formed in a small thickness by sealing the component parts including the semiconductor device 2120 in the resin molding 2140 such that the surfaces of the terminal members 2110 corresponding to the lower surface of the terminal forming sheet 2310 are exposed outside.

The plastic package can be formed in a small thickness by using a thin semiconductor device as the semiconductor device 2120.

The thickness of the plastic package in this example is equal to the sum of the respective thicknesses of the terminal forming sheet 2310 and the semiconductor device 2120.

Wire bonding for connecting the terminals of the semiconductor device 2120 to the inner terminals 2111 facilitates connecting work and ensures the reliability of connection.

The plastic package can be fabricated by a plastic package fabricating method of a multiple-chip fabricating system, which will be described later and is suitable for mass production.

A molding step for sealing the component parts in the resin molding 2140 does not need any cavity of a special shape. The component parts need to be held simply between flat plates for molding. Thus, the construction of the plastic package is desirable from the viewpoint of equipment.

Materials suitable for forming the terminal members 2110 are Cu, a Cu-base alloy, or a Fe—Ni alloy containing 42% Ni. Generally, Cu or a Cu-base alloy is used owing to its high conductivity and desirable properties.

The outer side surfaces 2112b of the outer terminals 2112 are the cut edges of the terminal forming sheet 2310, and the other surfaces of the outer terminals 2112 are coated with a connecting plated layer.

The connecting plated layer is a plated metal layer chosen from a plated solder layer, a plated gold layer, a plated silver layer, a plated palladium layer and a plated tin layer.

Usually, the resin molding 2140 is formed of an epoxy resin. The resin molding 2140 may be formed of any suitable resin other than the epoxy resin.

Figure 12:
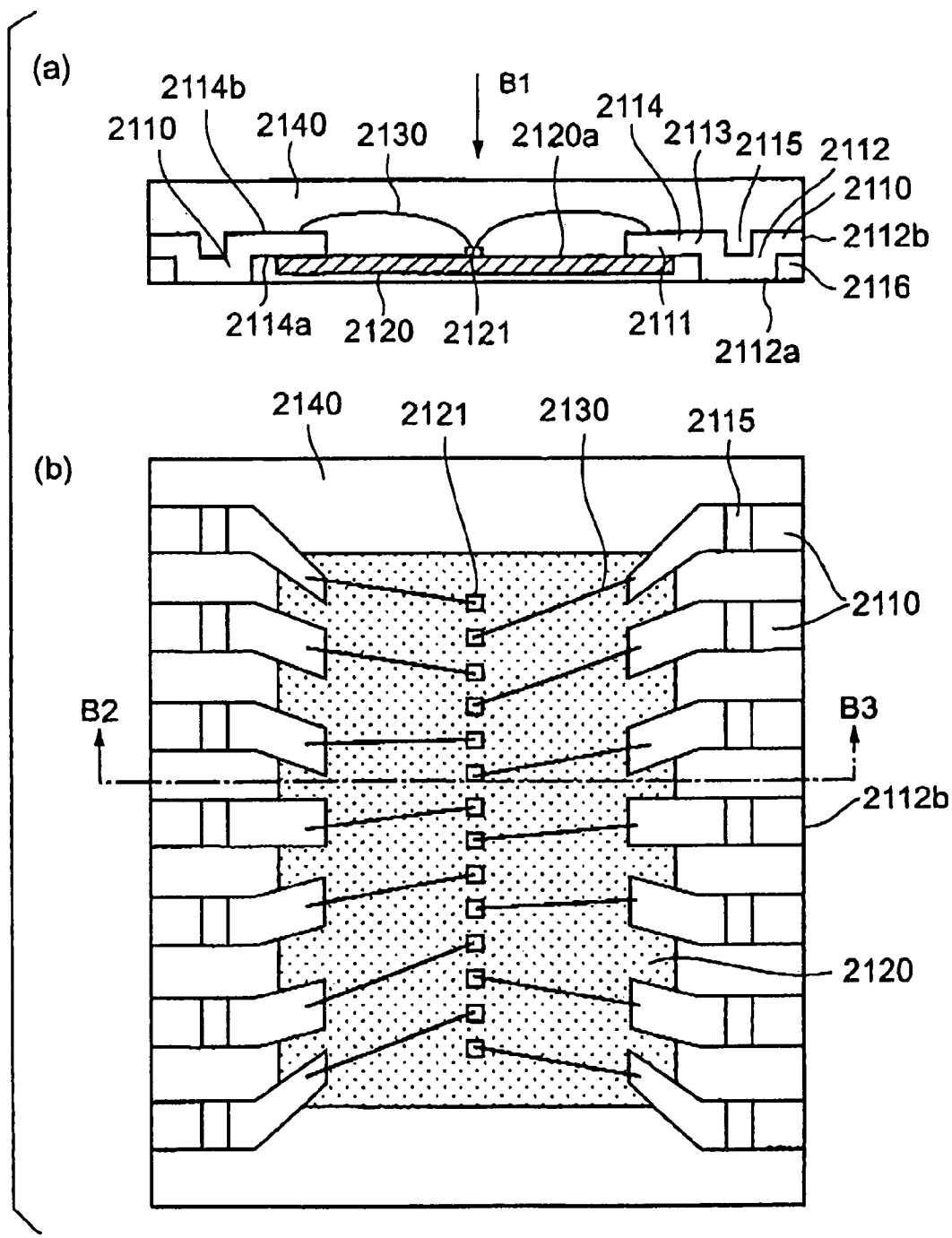
FIGS. 12(a) and 12(b) are views illustrating a plastic package in a second example of the second embodiment.

A plastic package in a second example of the second embodiment will be described with reference to FIG. 12.

The plastic package in the second example, similarly to the plastic package in the first example, is provided with terminal members 2110 formed by half-etching a terminal forming sheet 2310 and each consisting of an outer terminal 2112 to be connected to an external circuit, and leads 2114 including inner terminals 2111 to be connected to a semiconductor device 2120. Each external terminal 2112 has a thick portion of a thickness equal to that of the terminal forming sheet 2310, and the leads 2114 are formed by thinning portions of the terminal forming sheet 2310 by half-etching. Terminals 2121 of the semiconductor device 2120 are connected to the inner terminals 2111 of the predetermined terminal members 2110, respectively, with bond wires 2130 by wire bonding. Those component parts including the semiconductor device 2120 are sealed in a resin molding 2140 to form a flat, square plastic package. All the upper surfaces 2112c of the outer terminals 2112, all the lower surfaces 2112a of the outer terminals 2112, and all the etched surfaces 2114a of the leads 2114 of the terminal members 2110 are included in planes, respectively. The terminal members 2110 are arranged near the semiconductor device 2120 with the inner terminals 2112 extending inward.

The contact surfaces of the inner terminals 2111 of the plastic package in the second example, differing from those of the plastic package in the first example, are in a surface 2114b opposite the etched surfaces (the lower surfaces of the inner terminals) 2114a. The plastic package in the second example is a LOC (lead-on-chip) plastic package, in which the semiconductor device 2120 is mounted on the leads 2114 with its terminal surface 2120a in contact with the half-etched surfaces 2114a of the leads 2114.

The lower surfaces 2112a of the thick portions of the outer terminals on the side of the half-etched surface 2114a and the outer side surfaces 2112b of the outer terminals of the terminal members 2110 are exposed outside. The rest of the component parts are sealed in the resin molding 2140.

The plastic package in the second example can be formed in a small thickness by sealing the component parts including the semiconductor device 2120 in the resin molding 2140 such that the surfaces of the terminal members 2110 corresponding to the surface of the terminal forming sheet 2310 are exposed outside.

The thickness of the semiconductor device 2120 is smaller than a depth in which the terminal forming sheet 2310 is etched to form the terminal members 2110.

When the thickness of the terminal forming sheet 2310 for forming the terminal members 2110 is, for example, 0.2 mm, the thickness of the semiconductor device 2120 is in the range of 0.025 to 0.1 mm.

Wire bonding for connecting the terminals of the semiconductor device 2120 to the inner terminals 2111 facilitates connecting work and ensures the reliability of connection.

Although the position of the semiconductor device 2120 relative to the leads 2114 in the plastic package in the second example is different from that in the plastic package in the first example, the plastic package in the second example can be fabricated by a plastic package fabricating method of a multiple-chip forming system basically similar to the plastic package fabricating method of fabricating the plastic package in the first example. The plastic package in the second example is suitable for mass production.

A molding step for sealing the component parts of the plastic package in the second example in the resin molding 2140, similarly to that for sealing the component parts of the plastic package in the first example in the resin molding 2140, does not need any cavity of a special shape. The component parts need to be held simply between flat plates for molding. Thus, the construction of the plastic package is desirable from the viewpoint of equipment.

The component parts of the plastic package in the second embodiment are the same as those of the plastic package in the first example.

Figure 13:
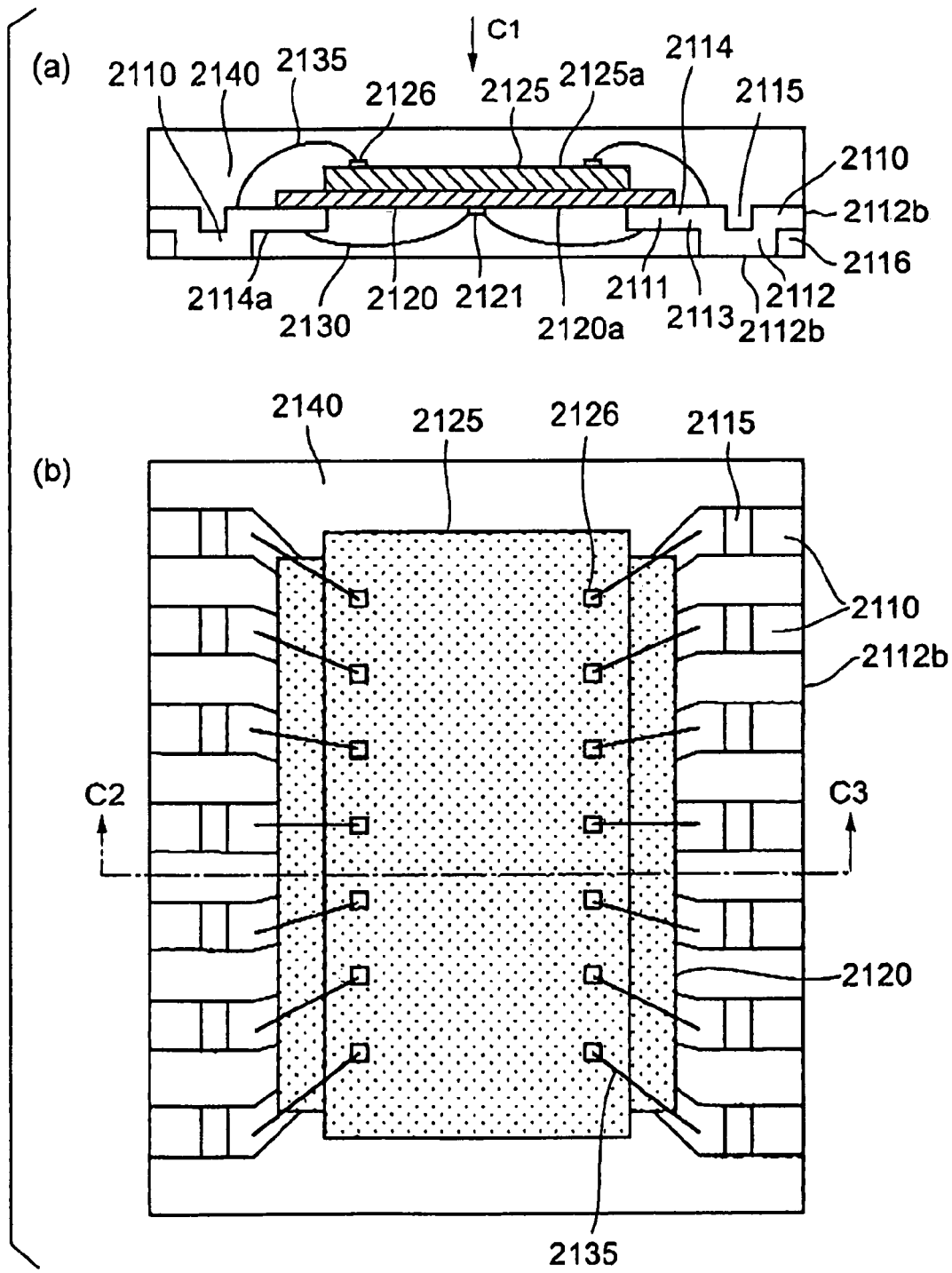
FIGS. 13(a) and 13(b) are views illustrating a plastic package in a third example of the second embodiment.

A plastic package in a third example will be described with reference to FIG. 13.

A plastic package in the third example is formed by mounting a semiconductor device 2125 of a peripheral-pad type (additional semiconductor device) on a surface of the semiconductor device 2120 opposite a terminal surface 2120a of the plastic package in the first example. The semiconductor device 2125 is provided with terminal pads 2126 on a surface opposite a surface thereof facing the semiconductor device 2120. The terminals 2126 of the semiconductor device 2125 are connected to leads 2114 by wire bonding.

The component parts of the plastic package in the third example, similarly to those of the plastic package in the first embodiment, are sealed in a resin molding such that the surfaces of terminal members 2110 corresponding to one of the surfaces of a terminal forming sheet 2310 are exposed outside. Therefore, the plastic package can be formed in a small thickness even though the semiconductor devices 2120 and 2125 are stacked.

Although the plastic package is provided with the two semiconductor devices 2120 and 2125, the plastic package can be fabricated by a plastic package fabricating method of a multiple-chip system basically the same as that of fabricating the plastic package in the first example. The molding step of the plastic package fabricating method of fabricating the plastic package in the third example, similarly to that of fabricating the plastic package in the first example, does not need any cavity of a special shape. The component parts of the plastic package held simply between flat plates can be easily sealed in the resin molding by the molding step, which is desirable from the viewpoint of equipment.

The component parts of the plastic package in the third example are the same as those of the plastic package in the first example.

Figure 14:
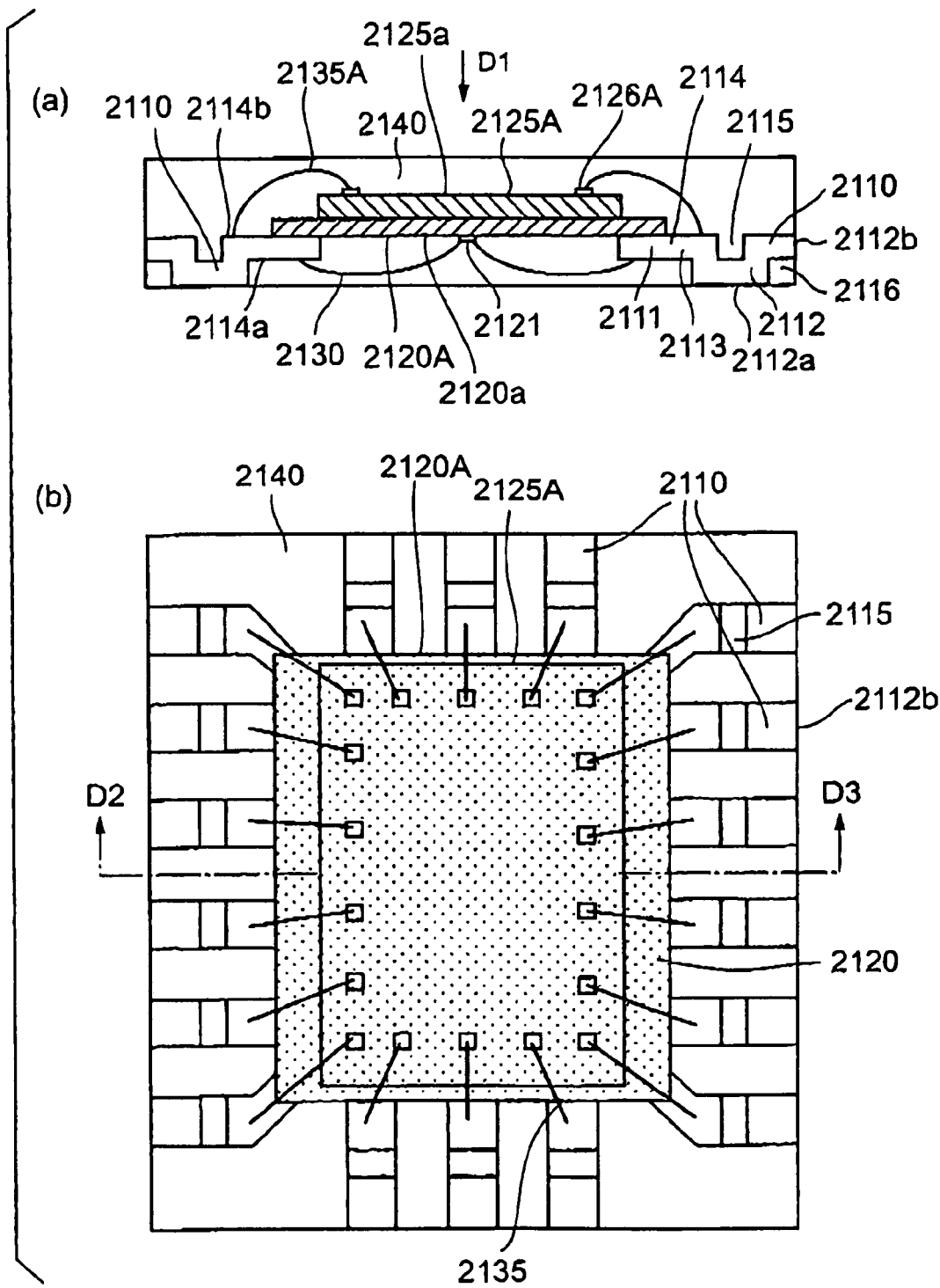
FIGS. 14(a) and 14(b) are views illustrating a plastic package in a fourth example of the second embodiment.

A plastic package in a fourth example will be described with reference to FIG. 14.

A plastic package in the fourth example is similar to that in the third example. The plastic package in the fourth example is formed by mounting a semiconductor device 2125A of a peripheral-pad type provided with terminal pads arranged along the four sides thereof on a surface of a semiconductor device 2120A of a center-pad type, and arranging terminal members 2110 along the four sides of the semiconductor devices 2120A and 2125A.

The terminals 2126A of the semiconductor device 2125A are connected to the surfaces 2114b of leads 2114 with bond wires 2135A.

The component parts of the plastic package in the fourth example, similarly to those of the plastic package in the first embodiment, are sealed in a resin molding such that the surfaces of terminal members 2110 corresponding to one of the surfaces of a terminal forming sheet 2310 are exposed. Therefore, the plastic package can be formed in a small thickness.

Although the plastic package is provided with the two semiconductor devices 2120A and 2125A, the plastic package can be fabricated by a plastic package fabricating method of a multiple-chip system basically the same as that of fabricating the plastic package in the first example. The molding step of the plastic package fabricating method of fabricating the plastic package in the fourth example, similarly to that of fabricating the plastic package in the first example, does not need any cavity of a special shape. The component parts of the plastic package held simply between flat plates can be easily sealed in the resin molding by the molding step, which is desirable from the viewpoint of equipment.

The component parts of the plastic package in the fourth example are the same as those of the plastic package in the first example.

FIGS. 15(a), 15(b) and 15(c) show plastic packages in modifications of the plastic packages in the first, the second and the third example, respectively. The plastic packages in those modifications differ from those in the first, the second and the third example in that the lower surfaces 2112a on the side of a half-etched surface of thick parts of outer terminals 2112 of terminal members 2110 are used as contact surfaces, and part of the outer side surfaces 21112b and the upper surfaces 2112c of the outer terminals 2112 of the terminal members are exposed to use the same as terminals.

A plastic package in a modification of the plastic package in the fourth example may be similar in construction as those modifications of the plastic packages in the first, the second and the third example.

Figure 16:
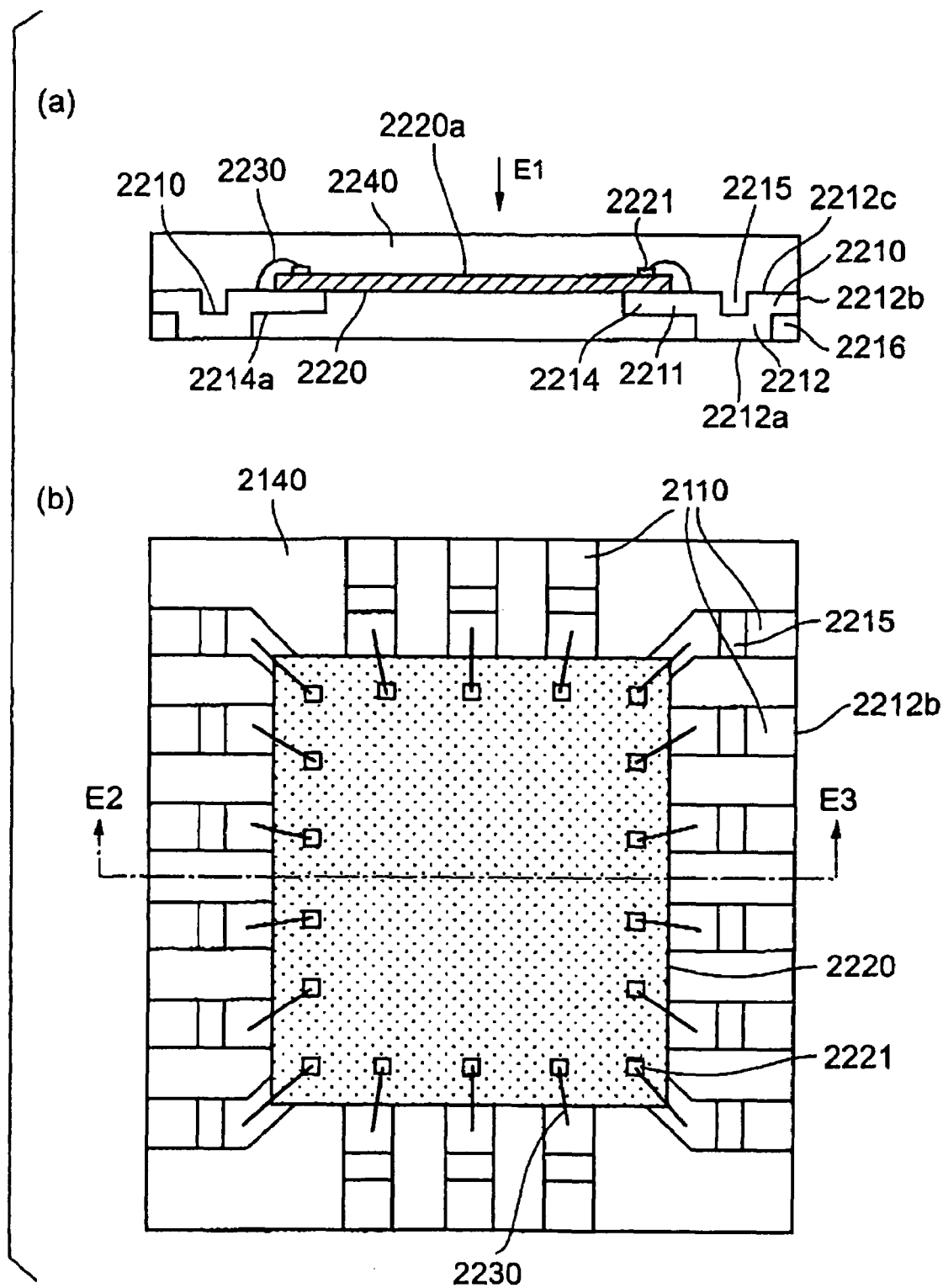
FIGS. 16(a) and 16(b) are views illustrating a plastic package in a fifth example of the second embodiment.

A plastic package in a fifth example will be described with reference to FIG. 16.

A plastic package in the fifth example is provided with terminal members 2210 similar to those of the plastic package in the first example, and a semiconductor device 2220 of a peripheral-pad type provided with terminal pads 2221 arranged along the four sides thereof. The terminals 2221 of the semiconductor device 2220 are connected to the inner terminals 2211 of the predetermined terminal members 2210, respectively with bond wires 2230.

The upper surfaces 2212c and the lower surfaces 2212a of the outer terminals 2212 of the terminal members 2210, and etched surfaces 2214a of leads 2214 are included in planes, respectively. The terminal members 2210 are arranged around the semiconductor device 2220 with the outer terminals 2212 extending outward and the inner terminals 2211 extending inward. The contact surfaces of the inner terminals 2211 are in a plane opposite the etched surfaces 2214a of leads 2214. The semiconductor device 2220 is mounted on the leads 2214 of the terminal members 2210 with a peripheral part of its lower surface opposite its terminal surface 2220a on which the terminals 2221 are arranged in contact with the leads 2214 to form a COL structure (chip-on-lead structure).

The component parts of the plastic package, similarly to those of the plastic package in the first example, are sealed in a resin molding with the back surfaces 2212a, on the half-etched surfaces 2214a of the terminal members 2210, of thick parts and outer side surfaces 2212*b* of the outer terminals 2212, i.e., contact surfaces 2212*a* and 2212*b*, exposed.

The component parts excluding the semiconductor device 2220 are the same as those of the plastic package in the first example. The plastic package in the fifth example, similarly to that in the first example, is suitable for mass production and can be fabricated by a plastic package fabricating method of a multiple-chip fabricating system. The molding step of the plastic package fabricating method of fabricating the plastic package in the fifth example, similarly to that of fabricating the plastic package in the first example, does not need any cavity of a special shape. The component parts of the plastic package held simply between flat plates can be easily sealed in the resin molding by the molding step, which is desirable from the viewpoint of equipment.

The component parts of the plastic package in the fifth example are the same as those of the plastic package in the first example.

Figure 17:
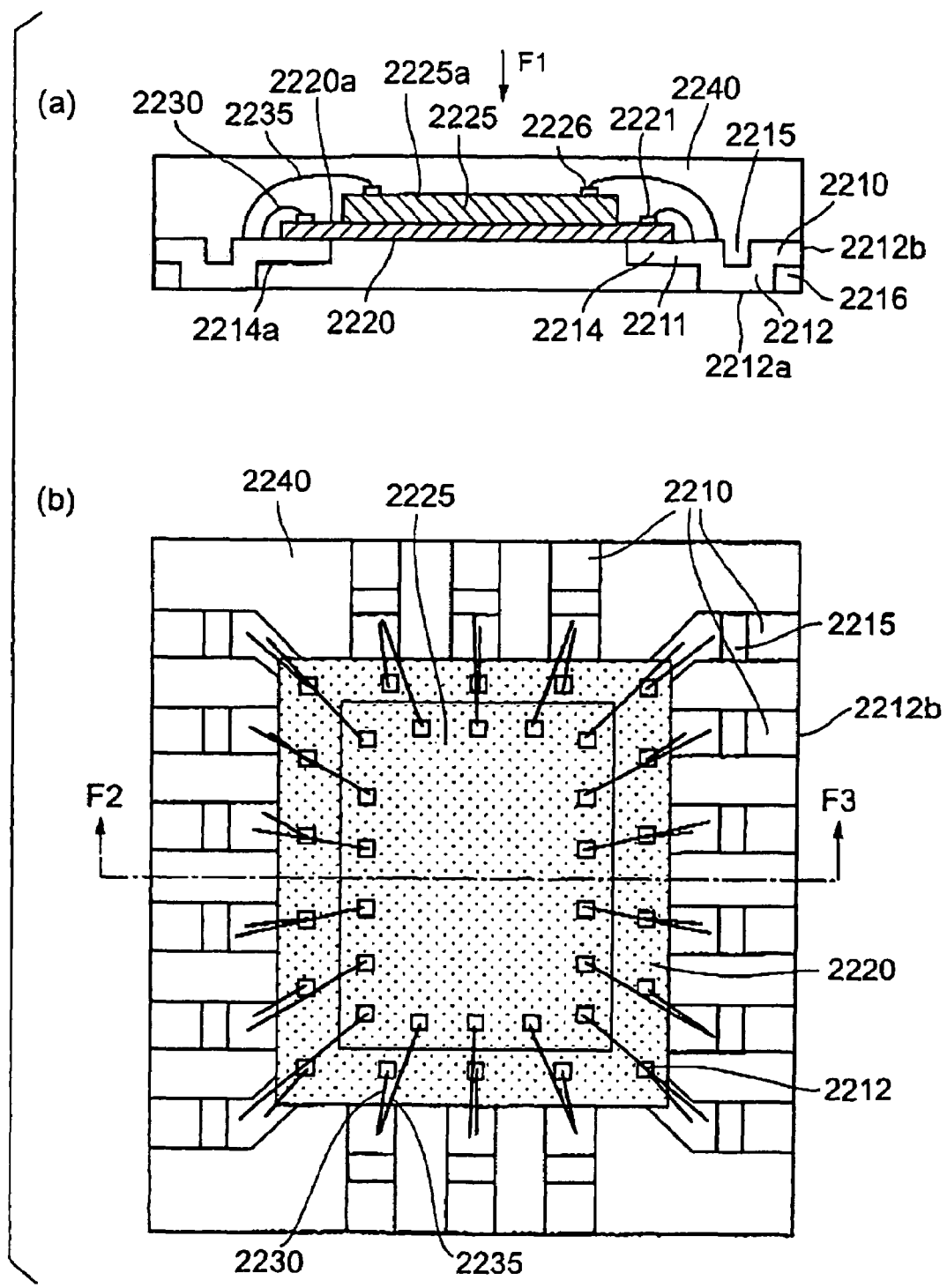
FIGS. 17(a) and 17(b) are views illustrating a plastic package in a sixth example of the second embodiment.

A plastic package in a sixth example will be described with reference to FIG. 17.

The plastic package in the sixth example is formed by mounting a semiconductor device 2225 of a peripheral-pad type on the terminal surface 2220*a* of a semiconductor device 2220. The semiconductor device 2225 is provided with terminal pads 2226 on a surface opposite a surface thereof facing the semiconductor device 2220. The terminal pads 2226 of the semiconductor device 2225 are connected to leads 2114 by wire bonding.

The component parts of the plastic package in the sixth example, similarly to those of the plastic package in the first embodiment, are sealed in a resin molding such that the surfaces of terminal members 2110 corresponding to one of the surfaces of a terminal forming sheet 2310 are exposed. Therefore, the plastic package can be formed in a small thickness even though the semiconductor devices 2220 and 2225 are stacked.

The plastic package in the sixth example provided with the two semiconductor devices, similarly to that in the first example, is suitable for mass production and can be fabricated by a plastic package fabricating method of a multiple-chip fabricating system. The molding step of the plastic package fabricating method of fabricating the plastic package in the sixth example, similarly to that of fabricating the plastic package in the first example, does not need any cavity of a special shape. The component parts of the plastic package held simply between flat plates can be easily sealed in the resin molding by the molding step, which is desirable from the viewpoint of equipment.

The component parts of the plastic package in the sixth example are the same as those of the plastic package in the first example.

Resin moldings included in plastic packages shown in FIG. 18(*a*) and 18(*b*) in modifications of the plastic packages in the fifth and the sixth example are somewhat different from those included in the plastic packages in the fifth and the sixth example. As shown in FIGS. 18(*a*) and 18(*b*), the component parts of each of the plastic packages in the modifications are sealed in a resin molding 2240 such that the lower surfaces 2212*a*, on the side of a half-etched surface, of thick parts, the outer side surfaces 2212*b* and portions of the upper surfaces 2212*c* of the external terminals 2212 of terminal members 2210, i.e., contact surfaces, are exposed.

A plastic package fabricating method of fabricating the plastic package in the first example will be described with reference to FIGS. 19 and 20.

Resist films 2320 respectively having predetermined patterns are formed on the opposite surfaces of a terminal forming sheet 2310 as shown in FIG. 19(*a*). Both the surfaces of the terminal forming sheet 2310 are etched to form pairs of terminal members 2330 for a plurality of semiconductor devices as shown in FIG. 19(*b*). Each pair of terminal members are connected by a connection 2336.

Thus, a processed sheet 2310A having the pairs of terminal members 2330 for a plurality of plastic packages is formed.

The terminal forming sheet 2310 is a sheet of Cu, a Cu-base alloy, a Fe—Ni alloy containing 42% Ni or the like. A ferric chloride solution is used as an etchant.

There is not particular restrictions on the resist films 2320, provided that the resist films 2320 are capable of withstanding the etching action of the etchant, of being patterned in a desired resolution and of being easily processed.

The resist films 2320 are removed from the processed sheet 2310A as shown in FIG. 19(*c*), the processed sheet 2310A is subjected to processes including a cleaning process. Then, the processed sheet 2310A is coated entirely with a plated layer 2310B for connection. Then, a predetermined number of semiconductor devices 2340 are located at predetermined positions, respectively, and are mounted on the leads 2337 of terminal members 2330 as shown in FIG. 19(*d*).

Then, the terminal pads 2341 of the semiconductor devices 2340 are connected to the half-etched contact surfaces of the inner terminals 2111 of the terminal members 2330 with bond wires 2350, respectively, as shown in FIG. 19(*e*).

Then, a molding tape 2360 is attached to the half-etched surface 2337*a* of the processed sheet 2310A as shown in FIG. 19(*f*).

Then, the processed sheet 2310A is held between a pair of flat molding plates 2371 and 2372, and then the processed sheet 2310A held between the pair of flat molding plates 2371 and 2372 is sealed in a resin molding 2380 by molding as shown in FIG. 20(*a*).

The connections 2336 connecting the terminal members 2330 of the processed sheet 2310A are provided with through holes. A resin for forming packages flows through the through holes of the connections 2336 during a molding process.

Figure 11:
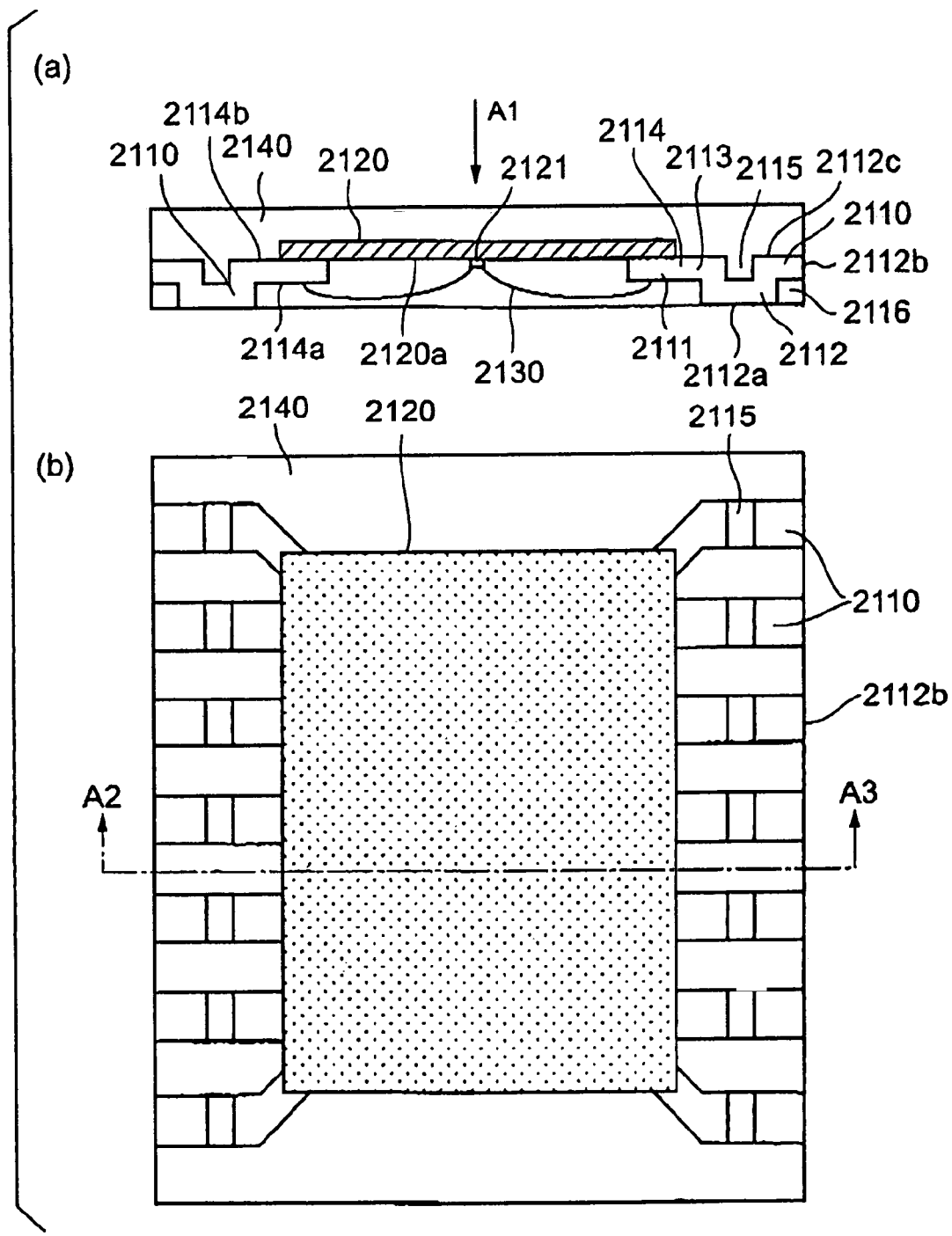
FIGS. 11(a) and 11(b) are views illustrating a plastic package in a first example of a second embodiment according to the present invention.

Thus, the plastic package in the first example shown in FIG. 11 is fabricated.

The molding plates 2371 and 2372 are removed, and then the molding tape 2360 is removed as shown in FIG. 20(*b*). Then, a cutting tape 2365 is applied to the resin molding 2380 as shown in FIG. 20(*c*).

Then, the resin molding 2380 is cut from a side opposite the side of the cutting tape 2365 with a dicing saw, not shown, to obtain individual plastic packages as shown in FIG. 20(*d*).

The resin molding 2380 is cut with the dicing saw, not shown, along cutting lines, for example, shown in FIG. 21(*a*) or 21(*b*).

In FIG. 21, individual plastic packages 2401 are demarcated by cutting lines 2485 corresponding to the grooves 2334 formed in the connections 2336 shown in FIG. 20.

The processed sheet 2310A is called also a frame.

The cut surfaces of the processed sheet 2310A are the outer side surfaces of the outer terminals of the plastic packages.

Surfaces of the cut parts 2334A other than the cut surfaces are plated and can be easily used for connection.

The plastic package in the first example shown in FIG. 11 is thus fabricated.

Although the plastic packages in the second to the sixth example differ from each other in the positional relation between the semiconductor device and the leads of the terminal members, in the step of stacking the semiconductor devices or the step of electrically connecting the semiconductor device and the terminal members by wire bonding, plastic package fabricating methods for fabricating those plastic packages are substantially similar to that for forming the plastic package in the first example.

Figure 15:
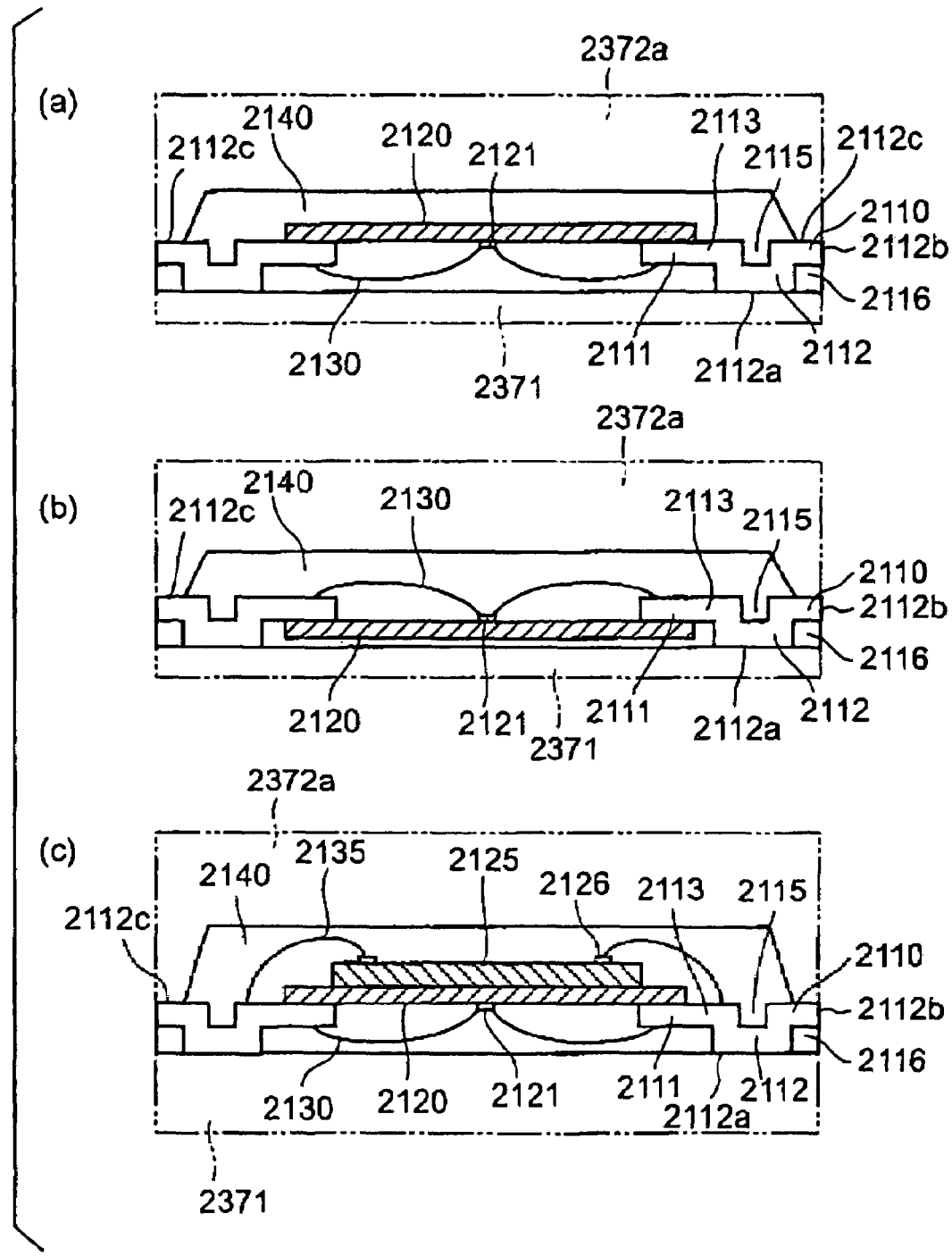
FIGS. 15(a) to 15(c) are views illustrating plastic packages in modifications of the first, the second and the third example.

In the plastic packages, shown in FIG. 15, in modifications of the first example and the plastic packages in the fifth and the sixth example shown in FIG. 18, the lower surfaces, on the side of the half-etched surfaces of the terminal members, of the thick parts of the outer terminals are exposed, and the outer side surfaces and the upper surfaces of the outer terminals of the terminal members are partially exposed, and the rest of the component parts are sealed in the resin molding. The component parts can be sealed in the resin molding by putting a flat plate 2371 on one side of the assembly of the component parts so as to cover the contact surfaces, to be exposed, of the external terminals, and putting a mold 2372a on the other side of the assembly of the component parts to form a predetermined cavity after mounting the plurality of semiconductor devices on the leads and connecting the semiconductor devices to the corresponding inner terminals by wire bonding by the plastic package fabricating method as mentioned in connection with FIGS. 19 and 20, and pouring the resin in the cavity.

For example, a mold capable of forming a cavity for sixteen plastic packages in a region G as shown in FIG. 21(a) is used, and a molding process is repeated for regions G.

As apparent from the foregoing description, the present invention achieves the further reduction of the thickness of plastic packages at a low cost and provides plastic packages suitable for mass production. The present invention achieves the reduction of the thickness of the QFN or the SON package provided with a semiconductor device of a center-pad type. The present invention provides a plastic package fabricating method of fabricating such a thin plastic package.

Third Embodiment

A third embodiment of the present invention will be described with reference to the accompanying drawings.

Figure 26:
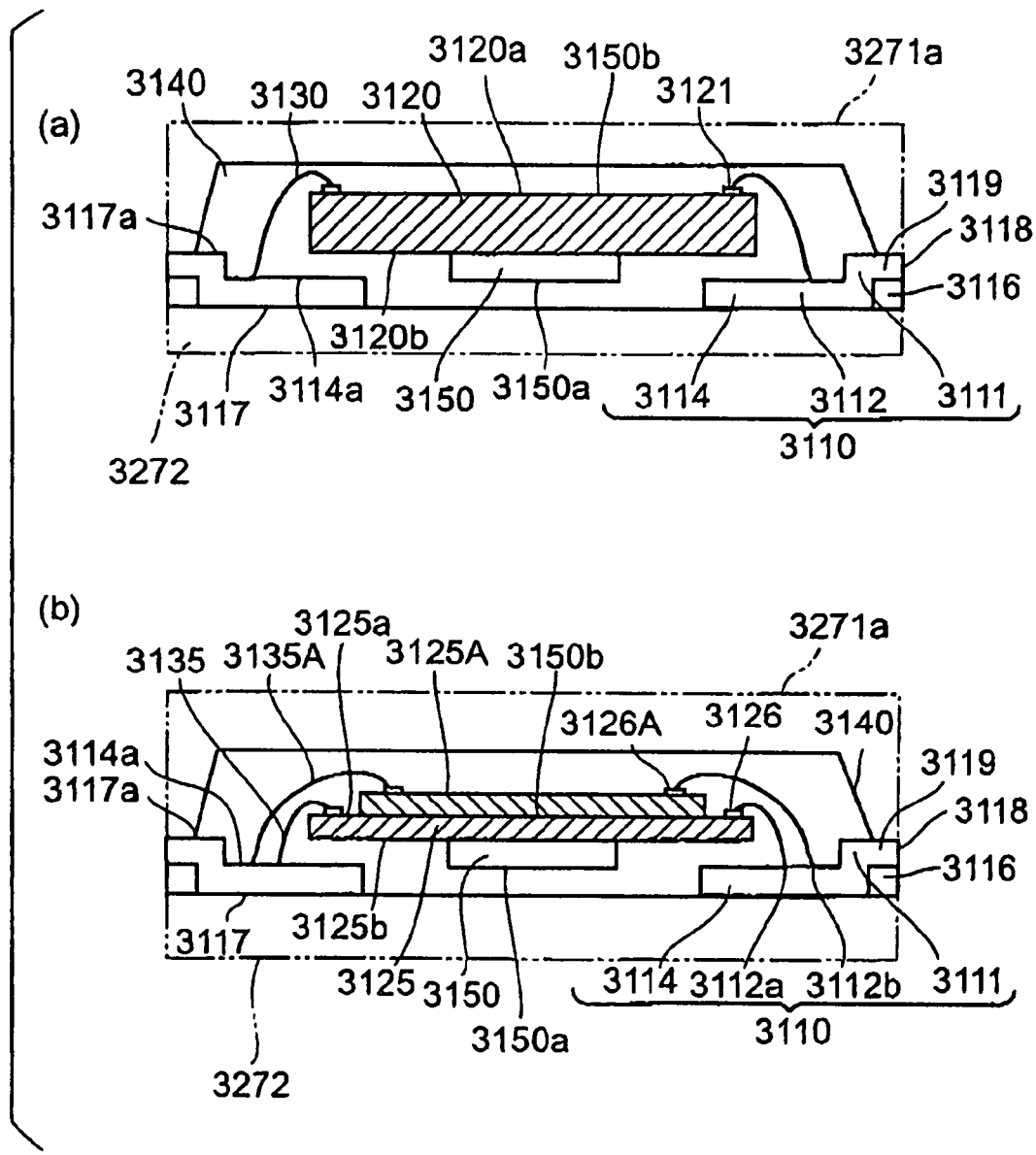
FIGS. 26(a) and 26(b) are views illustrating plastic packages in modifications of the plastic packages in the first and the third example of the third embodiment, respectively.
Figure 27:
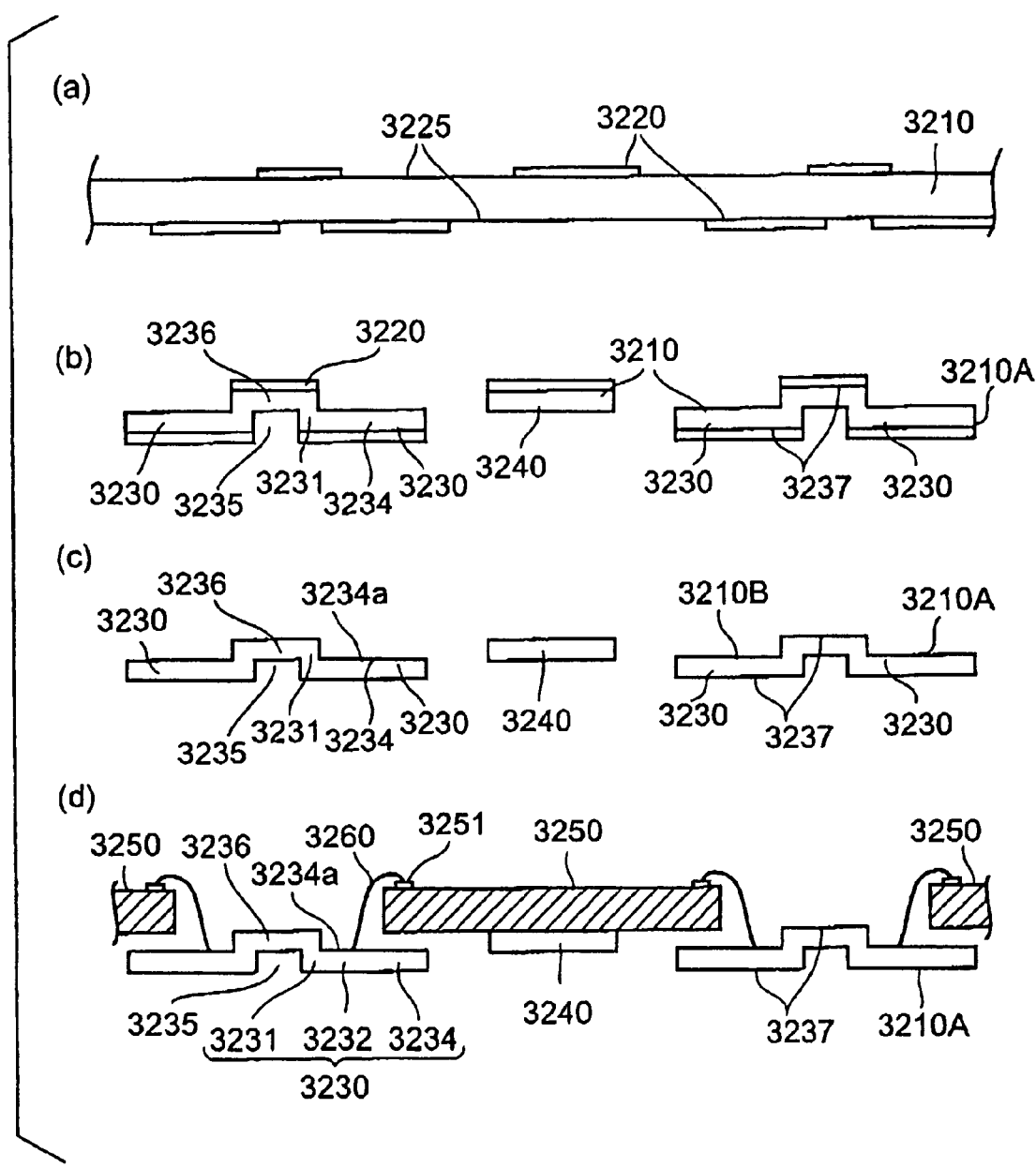
FIGS. 27(a) to 27(d) are views illustrating steps of a plastic package fabricating method in an example.
Figure 28:
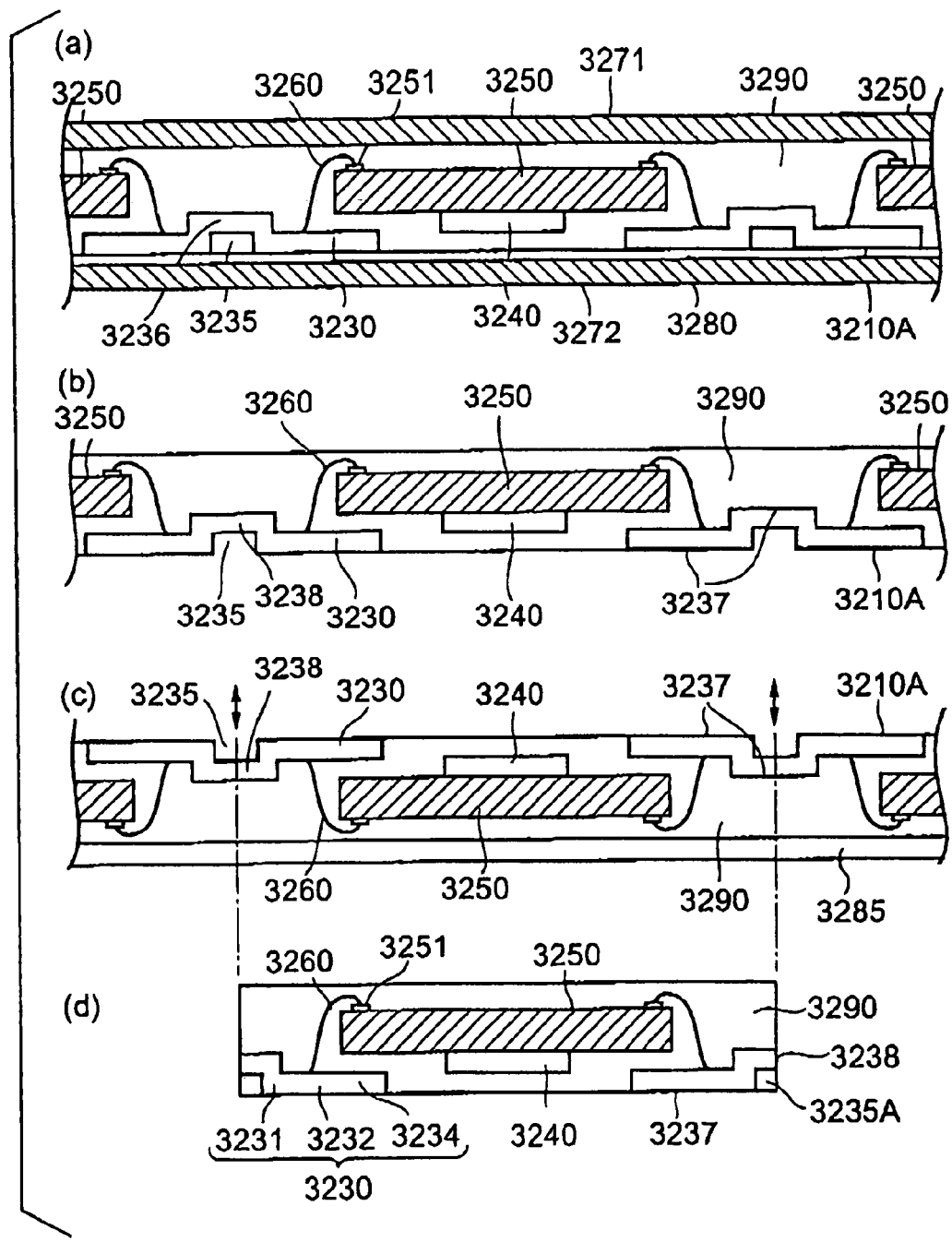
FIGS. 28(a) to 28(d) are views illustrating steps following those illustrated in FIGS. 27(a) to 27(d)
Figure 29:
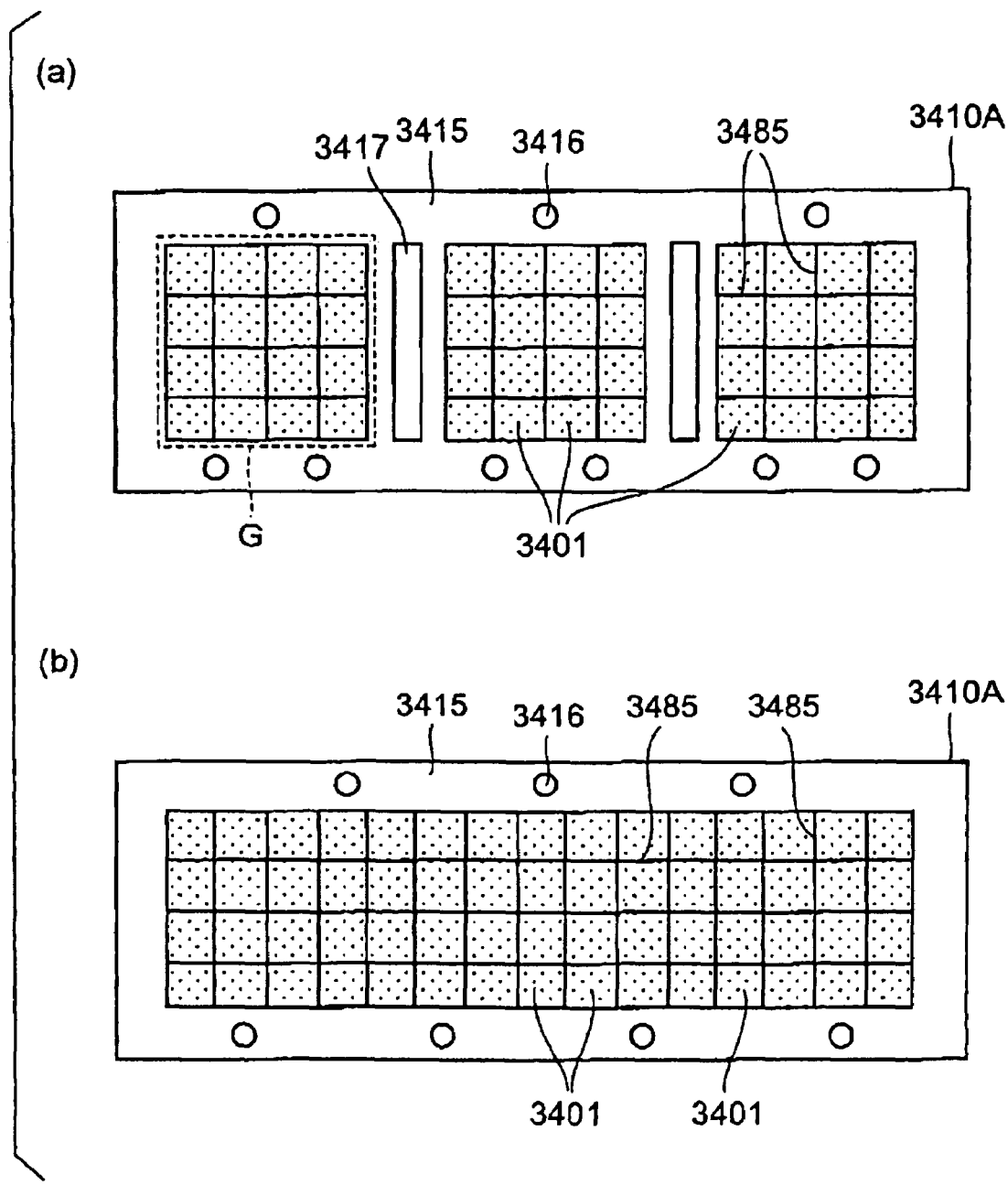
FIG. 29(a) and 29(b) are views of assistance in explaining a dicing operation using a dicing saw.

FIG. 22(a) is a sectional view of a plastic package in a first example of a third embodiment according to the present invention, FIG. 22(b) is a view taken in the direction of the arrow A1 in FIG. 22(a), FIG. 23(a) is a sectional view of a plastic package in a second example of the second embodiment, FIG. 23(b) is a view taken in the direction of the arrow B1 in FIG. 23(a), FIG. 24(a) is a sectional view of a plastic package in a third example of the third embodiment, FIG. 24(b) is a view take in the direction of the arrow C1 in FIG. 24(a), FIG. 25(a) is a sectional view of a plastic package in a fourth example of the third embodiment, FIG. 26(b) is a view take in the direction of the arrow D1 in FIG. 25(a), FIGS. 26(a) and 26(b) are views of plastic packages in modifications of the first and the third example, respectively, FIG. 27 is sectional views illustrating some of the steps of a plastic package fabricating method in an example according to the present invention, FIG. 28 is sectional views illustrating steps following those illustrated by FIG. 27, and FIG. 29 is a view of assistance in explaining a dicing operation.

FIG. 22(a) is a sectional view taken on the line A2-A3 in FIG. 22(b), FIG. 23(a) is a sectional view taken on the line B2-B3 in FIG. 23(b), FIG. 24(a) is a sectional view taken on the line C2-C3 in FIG. 24(b), and FIG. 25(a) is a sectional view taken on the line D2-D3 in FIG. 25(b).

Double-headed arrows in FIG. 28(c) indicate directions in which a dicing saw is moved.

Shown in FIGS. 22 to 29 are terminal members 3110, outer terminals 3111, inner terminals 3112, contact surfaces 3112a and 3112b, leads 3114, half-etched surfaces 3114a, cut parts 3116, nonetched surfaces 3117 and 3117a, side surfaces 3118, semiconductor devices (referred to also as "semiconductor chips" or "chips") 3120 and 3120A, contact surfaces 3120a, lower surfaces 3120b, terminals 3126 and 3126A, semiconductor devices referred to also as "semiconductor chips" or "chips") 3128 and 3128A, contact surfaces 3128a, lower surfaces 3128b, terminals 3129 and 3129A, bond wires 3130, 3135 and 3135A, bond wires 3136 and 3136A, a resin molding 3140, a die pad 3150, half-etched surfaces 3150a, nonetched surfaces 3150b, terminal forming sheet 3210, a processed sheet 3210 a, a resist film 3220, openings 3225, terminal members 3230, outer terminals 3231, inner terminals 3232, leads 3234, grooves 3235, cut parts 3235A, connections 3236, nonetched surfaces (exposed surfaces) 3237, side surfaces 3238, a die pad 3240, a semiconductor device 3250, terminals (terminal pads) 3251, bond wires 3260, flat molding plates 3271 and 3272, a molding tape 3280, a cutting tape 3285, a resin molding 3290, a component plastic package 3401, a terminal forming sheet 3410A, a frame 3415, a jig 3416, slots 3417 and cutting lines 3485.

Referring to FIGS. 22(a) and 22(b), a plastic package in a first example has a plurality of terminal members 3110 consisting of outer terminals 3111, and leads 3114 including inner terminals 3112, a die pad 3150 connected to the terminal members 3110, a semiconductor device 3120 mounted on the die pad 3150 and provided with terminal pads 3121 connected to the inner terminals 3112 with bond wires 3130, and a resin molding 3140 sealing the terminal members 3110, the die pad 3150, the semiconductor device 3120 and the bond wires 3130 therein. Each of the outer terminals 3111 has an upper surface 3117a, a lower surface 3117 and an outer side surface 3118. Each of the inner terminals 3112 has a contact surface 3114a.

The outer terminals 3111 to be connected to external circuits, and the leads 3114 including the inner terminals 3112 to be connected to the semiconductor device 3120 are connected integrally to form the terminal members 3110. A terminal forming sheet 3210 is processed by a half-etching process to form the outer terminals 2112 respectively having thick portions of a thickness equal to that of the terminal forming sheet 3210, and the leads 3114 thinner than the terminal forming sheet 3210. The die pad 3150 is formed by thinning a portion of the terminal forming sheet 3210 by half etching. The semiconductor device 3210 is of a peripheral-pad type. The terminal pads 3210 of the semiconductor device 3120 are arranged along two opposite sides of the semiconductor device 3120. The terminal pads 3121 of the semiconductor device 3120 are connected to the inner terminal pads 3121 of the predetermined terminal members 3110 with bond wires 3130, respectively. The assembly of the semiconductor device 3210, the terminal members 3110 and the bond wires 3130 is sealed in a resin to form a flat, square plastic package. The terminal members 3110 are arranged along two opposite sides of the semiconductor device 3120 to form a SON package.

All the upper surfaces 3117a of the outer terminals 3111, all the lower surfaces 3117 of the outer terminals 3111, and the contact surfaces (the etched surfaces) 3114a of the inner terminals 3112 of terminal members 3110 are included in planes, respectively. The terminal members 3110 are arranged near the semiconductor device 3120 with the outer terminals 3111 extending outward and the inner terminals 3112 extending inward. The half-etched surface of the die pad 3150 and the half-etched surfaces 3114a of the leads face opposite directions, respectively. The nonetched surface 3150b of the die pad 3150, and the nonetched surfaces (upper surfaces) 3117a of the outer terminals 3111 on the side of the half-etched surface 3114a of the terminal members 3110 are included in a plane.

The terminal surface 3120a of the semiconductor device 3120 and the half-etched surfaces 3114a of the terminal members 3110 face the same direction. The lower surface 3120b of the semiconductor device 3120 is in contact with the nonetched surface 3150b of the die pad 3150. The half-etched surfaces 3114a of the leads 3114 are the contact surfaces of the inner terminals 3112. The nonetched surfaces 3117, opposite the half-etched surfaces 3114a, of the leads 3114, and the outer side surfaces 3118 of the outer terminals 3111 are exposed outside, and the rest of the component parts are sealed in the resin molding 3140. Each of the nonetched surfaces 3117 forms the respective lower surfaces of the outer terminal and the lead 3114.

The semiconductor device 3120 is greater than the die pad 3150.

The plastic package in the first example can be formed in a small thickness by sealing the component parts in the resin molding 3140 such that the surfaces of the terminal members 3110 corresponding to a surface, forming the nonetched surfaces 3117, of the terminal forming sheet 3210 are exposed outside.

The plastic package can be formed in a small thickness by using a thin semiconductor device as the semiconductor device 3120.

The thickness of the plastic package is equal to the sum of the respective thicknesses of the terminal forming sheet 3210 and the semiconductor device 3120.

Wire bonding for connecting the terminals of the semiconductor device to the inner terminals facilitates connecting work and ensures the reliability of connection.

The plastic package can be efficiently mass-produced by a plastic package fabricating method of a multiple-chip fabricating system according to the present invention.

A molding step for sealing the component parts in the resin molding does not need any cavity of a special shape. The component parts need to be held simply between flat plates for molding. Thus, the construction of the plastic package is desirable from the viewpoint of equipment.

Materials suitable for forming the terminal members 1110 are Cu, a Cu-base alloy, or a Fe—Ni alloy containing 42% Ni. Generally, Cu or a Cu-base alloy is used owing to its high conductivity and desirable properties.

The outer side surfaces 3118 of the outer terminals 3111 are the cut edges of the terminal forming sheet 3210. Other surfaces are coated with a connecting plated layer.

The connecting plated layer is a plated metal layer chosen from a plated solder layer, a plated gold layer, a plated silver layer, a plated palladium layer and a plated tin layer.

Usually, the resin molding 3140 is formed of an epoxy resin. The resin molding 3140 may be formed of any suitable resin other than the epoxy resin.

A plastic package in a second example will be described with reference to FIG. 23.

Figure 23:
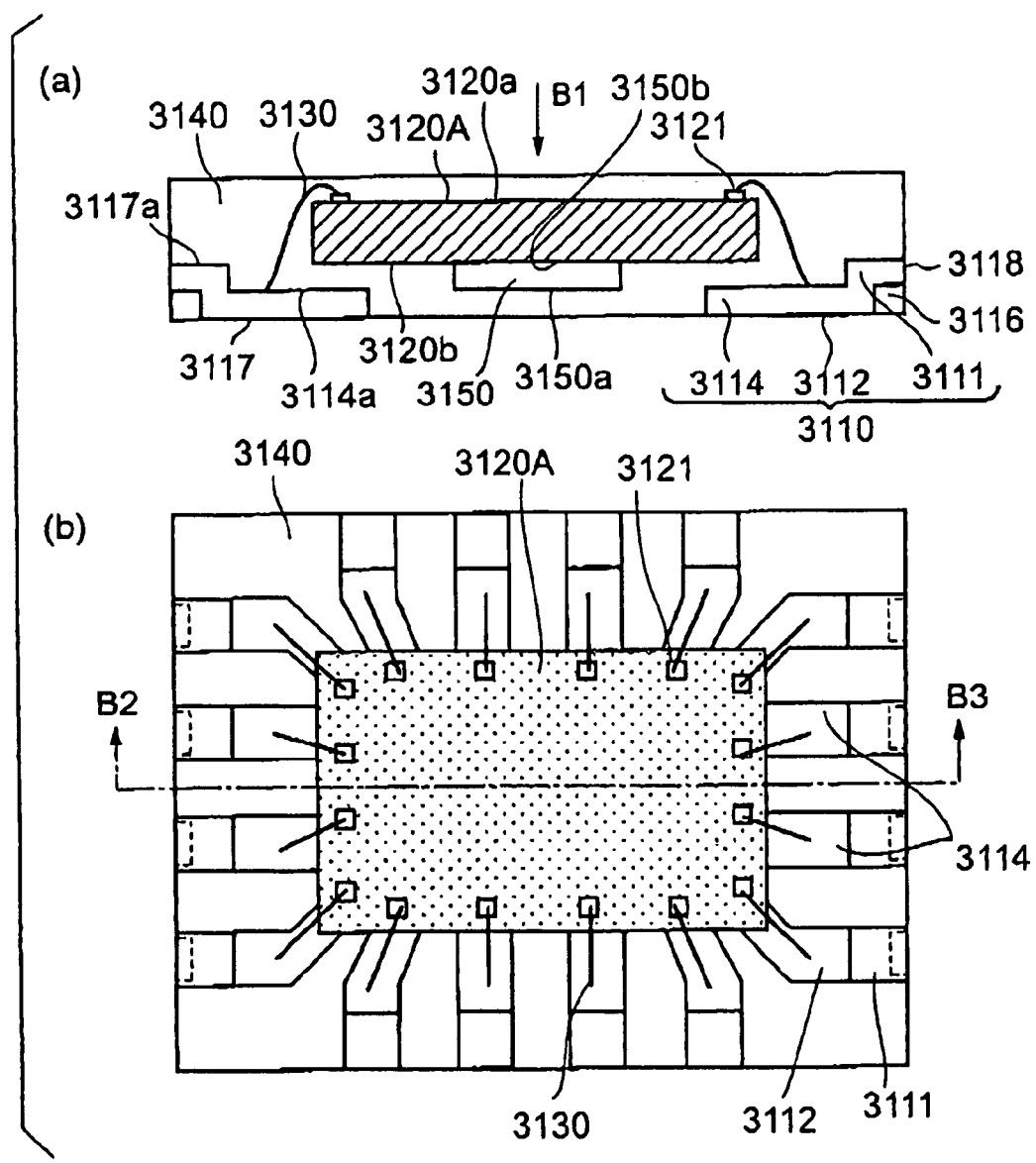
FIGS. 23(a) and 23(b) are views illustrating a plastic package in a second example of the third embodiment.

Referring to FIG. 23, the plastic package in the second example is provided with terminal members 3110 formed by integrally connecting outer terminals 3111 to be connected to external circuits, and leads 3114 including inner terminals 3112 to be connected to a semiconductor device 3120A. The terminal members 3110 are formed by processing a terminal forming sheet 3210 by a half-etching process. Each of the outer terminals 3111 has at least a thick portion of a thickness equal to that of the terminal forming sheet 3210. The leads 3114 are formed by thinning portions of the terminal forming sheet 3210 by a half-etching process. A die pad 3150 is formed by thinning a portion of the terminal forming sheet 3120 by a half-etching process. A semiconductor device 3120A of a peripheral-pad type provided with terminal pads 3121 arranged along the four sides thereof. The semiconductor device 3120a is mounted on the die pad 3150, and the terminal pads 3121 of the semiconductor device 3120A are connected to the inner terminals 3112 of the predetermined terminal members 3110, respectively, with bond wires 3130. Those component parts are sealed in a resin molding 3140 to form a flat, square plastic package. The plastic package in the second example is a QFN package in which the terminal members 3110 are arranged along the four sides of the semiconductor device 3120A.

In the plastic package in the second example, the terminal members are arranged along the four sides of the semiconductor device 3120A.

The component parts and construction of the plastic package in the second example, excluding the arrangement of the terminal members 3110 and the semiconductor device 3120A, are the same as those of the plastic package in the first example.

The nonetched surface 3117, on a side opposite the half-etched surfaces 3114a of the leads 3114, of the terminal members 3110, and the outer side surfaces 3118 of the outer terminals 3111 are exposed, and the rest of the component parts are sealed in the resin molding 3140. Thus, the plastic package can be formed in a small thickness.

The semiconductor device 3120A is greater than the die pad 3150.

Wire bonding for connecting the terminal pads 3121 of the semiconductor device 3120A to the 3112 facilitate connecting work and ensures the reliability of connection.

The plastic package in the second example, similarly to that in the first example, is suitable for mass production and can be fabricated by a plastic package fabricating method of a multiple-chip fabricating system.

The molding step of the plastic package fabricating method of fabricating the plastic package in the second example, similarly to that of fabricating the plastic package in the first example, does not need any cavity of a special shape. The component parts of the plastic package held simply between flat plates can be easily sealed in the resin molding 3140 by the molding step, which is desirable from the viewpoint of equipment.

The component parts of the plastic package in the second example are the same as those of the plastic package in the first example.

Figure 24:
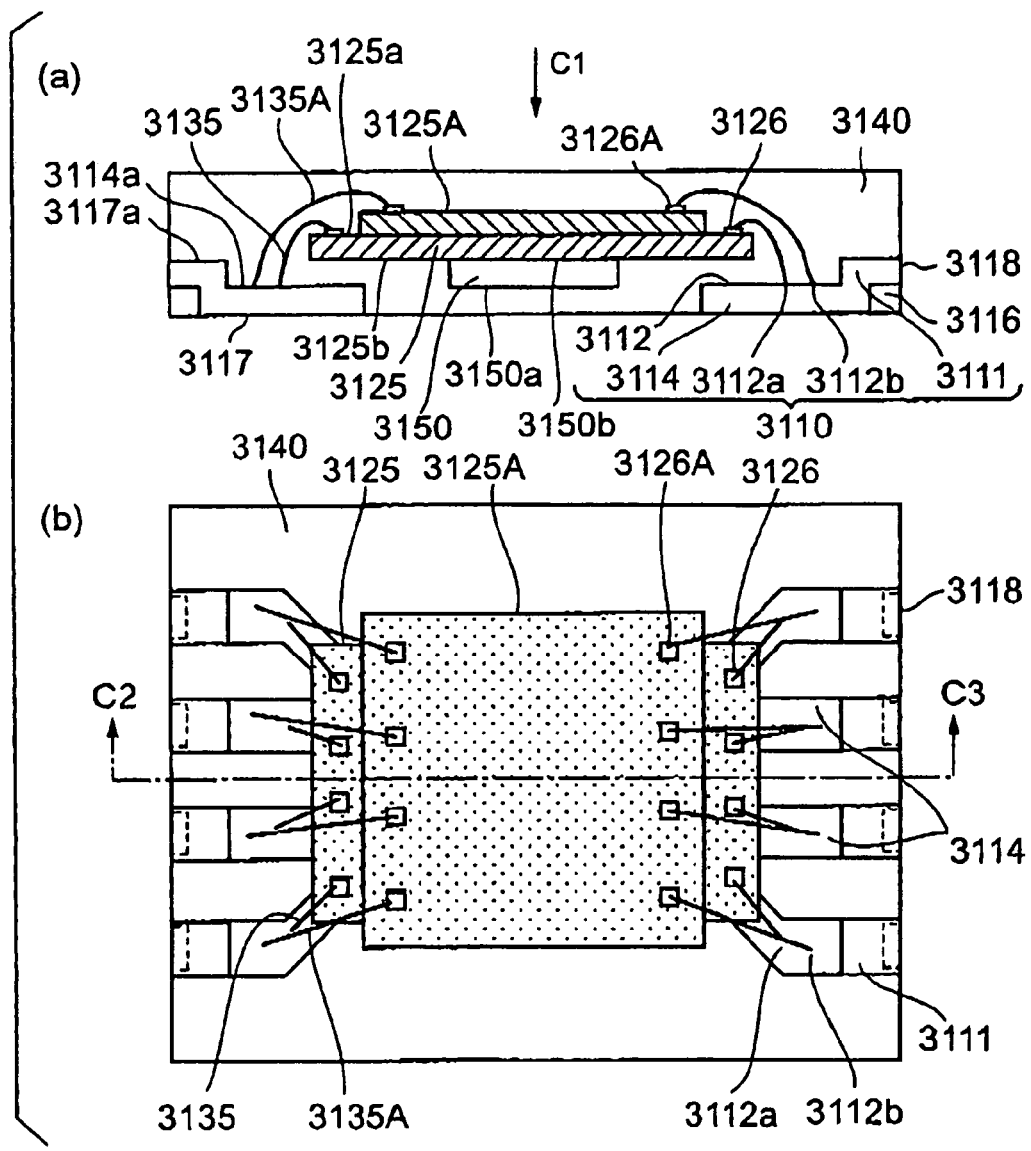
FIGS. 24(a) and 24(b) are views illustrating a plastic package in a third example of the third embodiment.

A plastic package in a third example will be described with reference to FIG. 24.

The plastic package in the third example, similarly to the plastic package in the first example, is provided with terminal members 3110 formed by integrally connecting outer terminals 3111 to be connected to external circuits, and leads 3114 including inner terminals 3112 to be connected to semiconductor devices 3125 and 3125A of a peripheral-pad type respectively provided with terminal pads 3126 and 3126A arranged along the two opposite sides thereof. The terminal members 3110 are formed by processing a terminal forming sheet 3210 by a half-etching process. Each of the outer terminals 3111 has at least a thick portion of a thickness equal to that of the terminal forming sheet 3210. The leads 3114 are formed by thinning portions of the terminal forming sheet 3210 by a half-etching process. A die pad 3150 is formed by thinning a portion of the terminal forming sheet 3120 by a half-etching process. The semiconductor devices 3125 and 3125A are stacked on the die pad 3150, the terminal pads 3126 and 3126A are connected to the inner terminals 3112 of the predetermined terminal members 3110 with bond wires 3135 and 3135A, and those component parts are sealed in a resin molding 3140 to form a SON plastic package.

All the upper surfaces 3117a of the outer terminals 3111, all the lower surfaces 3117 of the outer terminals 3111, and the contact surfaces 3114a of the inner terminals 3112 of the terminal members 3110 are included in planes, respectively. The terminal members 3110 are arranged near the semiconductor devices 3125 and 3125A with the outer terminals 3111 extending outward and the inner terminals 3112 extending inward. The half-etched surface 3150a of the die pad 3150 and the half-etched surfaces 3114a of the leads 3114 face opposite directions, respectively. The nonetched surface 3117 of the leads 3114 and the nonetched surfaces 3117 of the outer terminals 3111 are included in a plane.

In the plastic package in the third example, the terminal surface 3125a of the semiconductor device 3125 seated on the die pad 3150, and the half-etched surface 3114a of the terminal members 3110 face the same direction. the lower surface 3125b of the semiconductor device 3125 is in contact with the nonetched surface 3150b of the die pad 3150. The semiconductor device 3125A is mounted on the terminal surface 3125a of the semiconductor device 3125 seated on the die pad 3150.

The half-etched surfaces 3114a of the leads 3114 of the terminal members 3110 are the contact surfaces of the inner terminals 3112. The nonetched surfaces 3117, opposite the half-etched surfaces 3114a, of the leads 3114, and the outer side surfaces 3118 of the outer terminals 3111 are exposed, and the rest of the component parts are sealed in the resin molding 3140.

The terminal pads 3126 and 3126A of the semiconductor devices 3125 and 3125A are connected to the etched surfaces 3114a of the leads 3114 of the terminal members 3110.

In the plastic package in the third example, a surface of a terminal member forming sheet 3210, namely, a surface forming the nonetched surfaces 3117, is exposed outside. Thus, the plastic package provided with the two stacked semiconductors can be formed in a small thickness.

The plastic package in the third example provided with the two semiconductor devices 3125 and 3125A, similarly to the plastic package in the first example, can be efficiently mass-produced by a plastic package fabricating method of a multiple-chip fabricating system.

A molding step for sealing the component parts in the resin molding does not need any cavity of a special shape. The component parts need to be held simply between flat plates disposed on the opposite sides of the stacked semiconductor devices 3125 and 3125A for molding. Thus, the construction of the plastic package is desirable from the viewpoint of equipment.

The component parts of the plastic package in the third example are similar to those of the plastic package in the first example.

Figure 25:
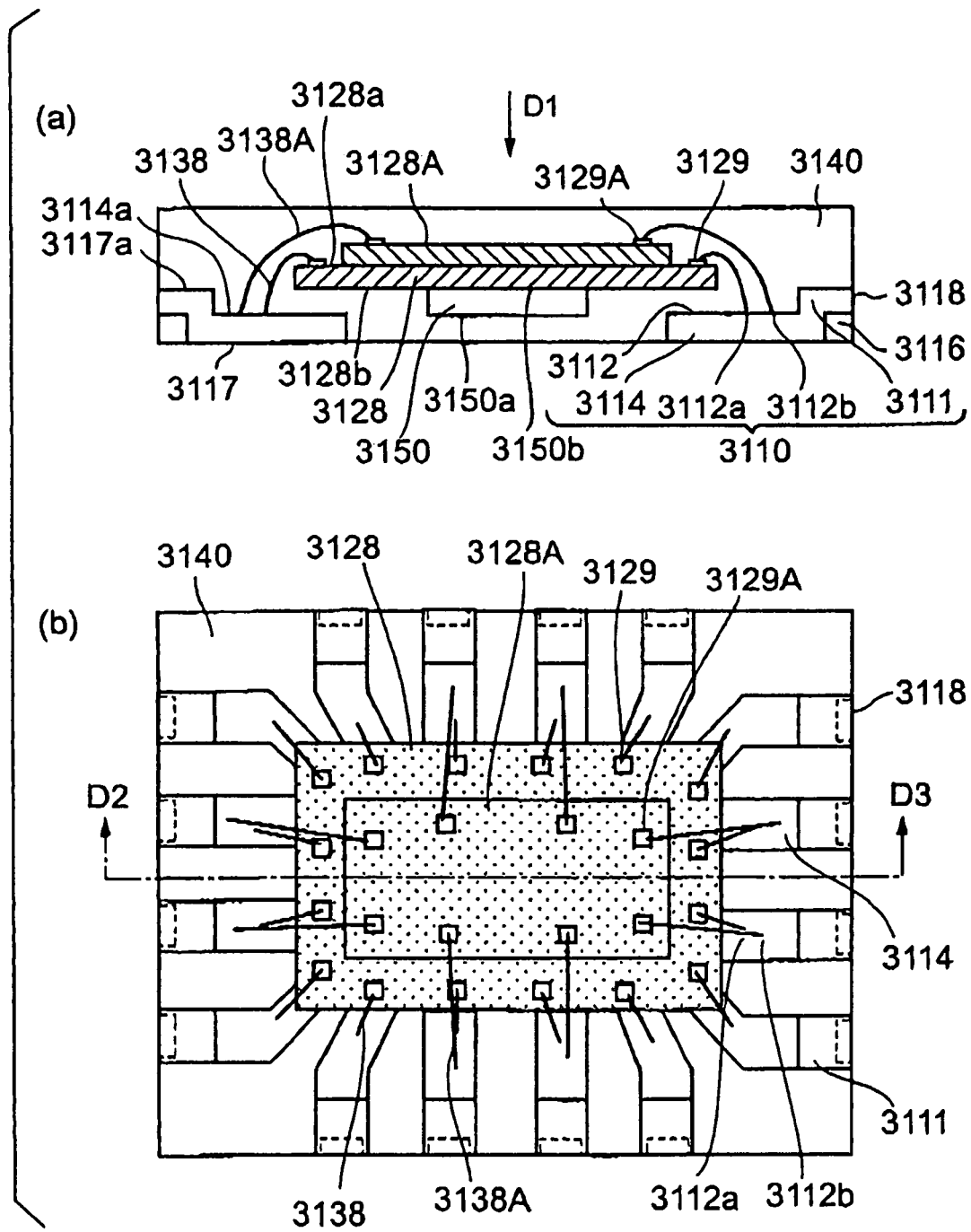
FIGS. 25(a) and 25(b) are views illustrating a plastic package in a fourth example of the third embodiment.

A plastic package in a fourth example will be described with reference to FIG. 25.

The plastic package in the fourth example, similarly to the plastic package in the first example, is provided with terminal members 3110 formed by integrally connecting outer terminals 3111 to be connected to external circuits, and leads 3114 including inner terminals 3112 to be connected to a semiconductor devices 3128 and 3128A. The terminal members 3110 are formed by processing a terminal forming sheet 3210 by a half-etching process. Each of the outer terminals 3111 has at least a thick portion of a thickness equal to that of the terminal forming sheet 3210. The leads 3114 are formed by thinning portions of the terminal forming sheet 3210 by a half-etching process. A die pad 3150 is formed by thinning a portion of the terminal forming sheet 3120 by a half-etching process. The semiconductor devices 3128 and 3128A of a peripheral-pad type are provided with terminal pads 3129 and 3129A arranged along the four sides thereof. The semiconductor devices 3128 and 3128A are stacked on the die pad 3150, and the terminal pads 3129 and 3129A of the semiconductor devices 3128 and 3128A are connected to the inner terminals 3112 of the predetermined terminal members 3110, respectively, with bond wires 3138 and 3138A. Those component parts are sealed in a resin molding 3140 to form a QFN plastic package.

The plastic package in the fourth example is provided with the semiconductor devices 3128 and 3128A provided with the terminal pads arranged along the four sides thereof instead of the semiconductor devices 3125 and 3125a of a peripheral-pad type provided with terminal pads arranged along the two opposite sides thereof, and the terminal members 3110 are arranged along the four sides of the semiconductor devices 3128 and 3128A.

The respective terminal pads 3129 and 3129A of the semiconductor devices 3128 and 3128A are connected to the etched surfaces 3114a of the leads 3114 of the terminal members 3110, respectively.

In the plastic package in the fourth example, a surface of the terminal forming sheet 3210, i.e., the nonetched surface 3117, similarly to that of the plastic package in the first example, is exposed. Thus, the plastic package in the fourth example can be formed in a small thickness.

The plastic package in the fourth example provided with the two semiconductor devices, similarly to that in the first example, is suitable for mass production and can be fabricated by a plastic package fabricating method of a multiple-chip fabricating system. The molding step of the plastic package fabricating method of fabricating the plastic package in the fourth example, similarly to that of fabricating the plastic package in the first example, does not need any cavity of a special shape. The component parts of the plastic package held simply between flat plates can be easily sealed in the resin molding by the molding step, which is desirable from the viewpoint of equipment.

The component parts of the plastic package in the fourth example are similar to those of the plastic package in the first example.

Resin moldings included in plastic packages in modifications of the plastic packages in the first and the third example are somewhat different from those included in the plastic packages in the first and the third example. As shown in FIGS. 26(*a*) and 26(*b*), the component parts of each of the plastic packages in the modifications are sealed in a resin molding 3140 such that the nonetched surfaces 3117, i.e., surfaces opposite half-etched surfaces 3114a, of leads 3114, outer side surfaces 3119 of outer terminals 3111, and portions of the upper surfaces 3117a of the outer terminals 3111 are exposed.

Plastic packages in modifications of the plastic packages in the second and the fourth example are similar to those plastic packages.

Plastic packages in modifications of the plastic packages in the third and the fourth example are provided with semiconductor devices of a center-pad type instead of the semiconductor device 3125A of the third example and the semiconductor device 3128A of the fourth example, respectively.

The plastic package in the third example may be provided with three or more stacked semiconductor devices instead of the semiconductor devices 3125 and 3125A, the plastic package in the fourth example may be provided with three or more stacked semiconductor devices instead of the semiconductor devices 3128 and 3128A, and those semiconductor devices may be connected to the internal terminals of the predetermined terminal members by wire bonding.

In the plastic packages in those modifications, a semiconductor device of a peripheral-pad type is seated on the die pad with its terminal surface facing a direction in which the half-etched surfaces of the terminal members face, and the lower surface thereof in contact with the nonetched surface of the die pad, and the semiconductor devices excluding the top semiconductor device are of a peripheral-pad type, and those semiconductor devices are stacked one on top of another on the semiconductor device mounted on the die pad.

A plastic package fabricating method of fabricating the plastic package in the first example in an example will be described with reference to FIGS. 27 and 28.

Resist films 3220 respectively having predetermined patterns are formed on the opposite surfaces of a terminal forming sheet 3210 as shown in FIG. 27(a). Both the surfaces of the terminal forming sheet 3210 are etched to form pairs of terminal members 3230 for a plurality of semiconductor devices as shown in FIG. 27(b). Each pair of terminal members are connected by a connecting part 3236.

Thus, a processed sheet 3210A having the pairs of terminal members 3230 each connected by the connecting part 3236 for a plurality of plastic packages is formed.

The terminal forming sheet 3210 is a sheet of Cu, a Cu-base alloy, a Fe—Ni alloy containing 42% Ni or the like. A ferric chloride solution is used as an etchant.

There is not particular restrictions on the resist films 3220, provided that the resist films 3220 are capable of withstanding the etching action of the etchant, of being patterned in a desired resolution and of being easily processed.

The resist films 3220 are removed form the processed sheet 3210A as shown in FIG. 27(c), the processed sheet 3210A is subjected to processes including a cleaning process. Then, the processed sheet 3210A is coated entirely with a plated layer 3210B for connection. Then, a predetermined number of semiconductor devices 3250 are located at predetermined positions on a surface, opposite a half-etched surface 3234a, of the processed sheet 3210A, respectively, and are mounted on die pads 3240, respectively. Then the terminal pads 3251 of the semiconductor devices 3250 are connected to the contact surfaces, i.e., the half-etched surfaces 3114a, of inner terminals 3112 of the terminal members 3230 with bond wires 3260 as shown in FIG. 27(d)

Then, a molding tape 3280 is attached to the half-etched surface 3234a of the processed sheet 3320A. Then, the processed sheet 3320A is held between a pair of flat molding plates 3271 and 3272, and then the processed sheet 3210A held between the pair of flat molding plates 3271 and 3272 is sealed in a resin molding 3290 by molding as shown in FIG. 28(a).

The connections 3236 connecting the terminal members 3230 of the processed sheet 3210A are provided with through holes. A resin for forming packages flows through the through holes of the connecting parts 3236 during a molding process.

The molding plates 3271 and 3272 are removed, and then the molding tape 3280 is removed as shown in FIG. 28(b). Then, a cutting tape 3285 is applied to the resin molding 3290 as shown in FIG. 28(c). Then, the resin molding 3290 is cut from a side opposite the side of the cutting tape 3285 with a dicing saw, not shown, to obtain individual plastic packages as shown in FIG. 28(d).

The resin molding 3290 is cut with the dicing saw, not shown, along cutting lines, for example, shown in FIG. 29(a) or 29(b).

In FIG. 29, individual plastic packages 3401 are demarcated by cutting lines 3485 corresponding to grooves 3235 formed in the connecting parts 3236 shown in FIG. 28(c).

The processed sheet 3210A is called also a frame.

The cut surfaces of the processed sheet 3210A are the outer side surfaces 3238 of the outer terminals of the plastic packages.

Surfaces of cut parts 3235A other than the cut surfaces are plated and can be easily used for connection.

Figure 22:
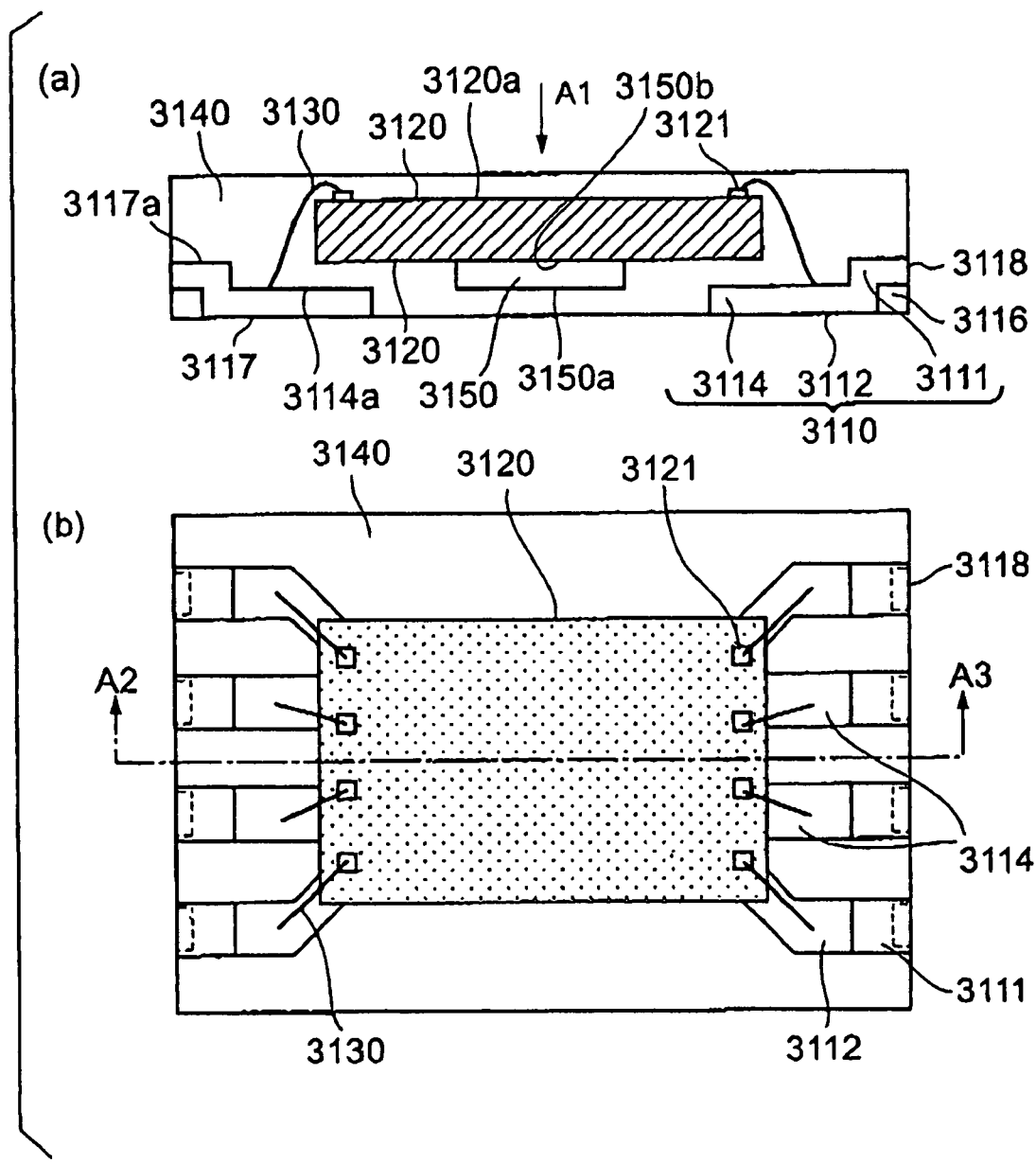
FIGS. 22(a) and 22(b) are views illustrating a plastic package in a first example of a third embodiment according to the present invention.

The plastic package in the first example shown in FIG. 22 is thus fabricated.

Although the plastic packages in the second to the fourth example differ from each other in the positional relation between the semiconductor device and the leads of the terminal members, in the step of stacking the semiconductor devices or the step of electrically connecting the semiconductor device and the terminal members by wire bonding, plastic package fabricating methods for fabricating those plastic packages are substantially similar to that for forming the plastic package in the first example.

In each of plastic packages shown in FIG. 26 in modifications of the plastic packages in the first and the third example, nonetched surfaces 3117, surfaces opposite the half-etched surfaces 3114a f the leads 3114, side surfaces 3119 of outer terminals 3111 of terminal members 3110, and portions of the upper surfaces 3117a of the outer terminals 3111 are exposed, and the rest of the component parts are sealed in a resin molding. This resin molding can be formed by the plastic package fabricating method illustrated in FIGS. 27 and 28; the component parts can be sealed in the resin molding by mounting a semiconductor device 3120 (semiconductor devices 3125 and 3125A) on a die pad 3150, connecting the semiconductor device 3120 (the semiconductor devices 3125 and 3125A) to terminal members 3110 with bond wires 3130 (bond wires 3135 and 3135A), attaching a flat plate 3272 to the lower surfaces, on one side of the assembly of the component parts, of the terminal members 3110, and putting a mold 3271a on the other side of the assembly of the component parts to form a predetermined cavity, and pouring the resin in the cavity.

For example, a mold capable of forming a cavity for sixteen plastic packages in a region G as shown in FIG. 29(a) is used, and a molding process is repeated for regions G.

Although plastic packages in other modifications need a step of stacking semiconductor devices and an additional wire bonding step, those plastic packages can be fabricated by plastic package fabricating methods substantially similar to those for fabricating the plastic packages shown in FIG. 26 in modifications of the plastic packages in the first and the third example.

As apparent from the foregoing description, the present invention achieves the further miniaturization and reduction of the thickness of plastic packages at a low cost and provides QFN OR SON plastic packages suitable for mass production and having high moisture resistance and high heat-dissipating ability. The present invention provides stacked QFN or SON packages. The present invention provides plastic package fabricating methods of fabricating such thin plastic packages.

The invention claimed is:

1. A plastic package comprising:
    a plurality of terminal members each having an outer terminal having an upper surface, a lower surface and an outer side surface, an inner terminal having a contact surface, and a connecting part connecting the outer and the inner terminal;

a semiconductor device provided with terminal pads connected to the contact surfaces of the inner terminals with bond wires; and a resin molding sealing the terminal members, the semiconductor device and the bond wires therein;

wherein the inner terminals of the terminal members are thinner than the outer terminals and have the contact surfaces, the contact surfaces of the inner terminals are included in one plane, the upper surfaces of the outer terminals are included in another plane, the lower surfaces of the outer terminals of the terminal members are included in a third plane, respectively, and the upper, the lower and the outer side surfaces of the outer terminals of the terminal members and a surface of the semiconductor device opposite the surface provided with the terminal pads are exposed outside, and the inner terminals, the bond wires, the semiconductor device and the resin molding are included in the thickness of the outer terminals, and wherein the inner terminal is located closer to the semiconductor device than the outer terminal, and the inner terminal has a half-etched upper surface lower than the upper surface of the outer terminal so that the thickness of the inner terminal is thinner than that of the outer terminal, and wherein each inner terminal is bent toward the corresponding terminal pad in a plan view, and the inner terminals on both the end sides have a tapered shape in the plan view, and wherein the semiconductor device has a thickness thinner than that of the inner terminals, and each inner terminal is so constructed that the section of the inner terminal is tapered toward the inside to leave a tip on the half-etched upper surface.

2. The plastic package according to claim 1, wherein the outer terminal of each terminal member has cut part on the outer side surface.

3. The plastic package according to claim 1, wherein each terminal member is formed of Cu, a Cu-base alloy or a Fe—Ni alloy containing 42% Ni.

4. The plastic package according to claim 1, wherein the contact surfaces of the inner terminals and the upper and lower surfaces of the outer terminals of the terminal members are coated with a plated metal layer selected from a plated solder layer, a plated gold layer, a plated silver layer, a plated palladium layer and a plated tin layer.

* * * * *